(12) United States Patent
Park et al.

(10) Patent No.: US 11,915,762 B2
(45) Date of Patent: Feb. 27, 2024

(54) APPARATUS AND METHOD FOR PROGRAMMING DATA IN A NON-VOLATILE MEMORY DEVICE

(71) Applicant: SK hynix Inc., Gyeonggi-do (KR)

(72) Inventors: Tae Hun Park, Gyeonggi-do (KR); Dong Hun Kwak, Gyeonggi-do (KR); Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 171 days.

(21) Appl. No.: 17/547,671

(22) Filed: Dec. 10, 2021

(65) Prior Publication Data

US 2022/0415401 A1 Dec. 29, 2022

(30) Foreign Application Priority Data

Jun. 25, 2021 (KR) .......................... 10-2021-0083197

(51) Int. Cl.
*G11C 16/00* (2006.01)
*G11C 16/10* (2006.01)
(Continued)

(52) U.S. Cl.
CPC ............ *G11C 16/10* (2013.01); *G06F 3/0604* (2013.01); *G06F 3/0659* (2013.01);
(Continued)

(58) Field of Classification Search
CPC . G11C 16/0483; G11C 16/3459; G11C 16/10; G11C 11/5628; G11C 16/12; G11C 2211/5621; G11C 16/24; G11C 16/3454; G11C 16/32; G11C 16/26; G11C 16/30; G11C 16/3404; G11C 11/5671; G11C 16/08; G11C 16/34; G11C 11/5642; G11C 16/3427; G11C 2216/20; G11C 16/16; G11C 2211/5648; G11C 29/52; G11C 11/5635; G11C 16/3409; G11C 16/3418; G11C 16/3486; G11C 2211/5644; G11C 11/5621; G11C 16/102; G11C 16/105; G11C 16/14; G11C 16/28; G11C 16/3413; G11C 16/3481; G11C 2029/0409; G11C 2029/0411; G11C 2029/5004; G11C 27/024; G11C 29/028; G11C 29/12;
(Continued)

(56) References Cited

U.S. PATENT DOCUMENTS 7,088,621 B2 * 8/2006 Guterman .......... G11C 16/0483
365/185.23
9,123,424 B2 9/2015 Oowada et al.
(Continued)

*Primary Examiner* — Thong Q Le
(74) *Attorney, Agent, or Firm* — IP & T GROUP LLP

(57) ABSTRACT

A memory device includes a controller that performs a program verification after a first program pulse is applied to the at least one non-volatile memory cell. The first program pulse is applied during a data program operation and the data program operation includes applying program pulses to program multi-bit data to the at least one non-volatile memory cell. The controller also determines a program mode for the at least one non-volatile memory cell based on a result of the program verification, and changes at least one of a level of a first control voltage based on the program mode. The first control voltage is applied to a drain select line coupled to the at least one non-volatile memory cell.

18 Claims, 14 Drawing Sheets

(51) Int. Cl.
  *G11C 16/04*    (2006.01)
  *G11C 16/34*    (2006.01)
  *G06F 3/06*     (2006.01)
  *G11C 11/56*    (2006.01)
  *G11C 16/24*    (2006.01)

(52) U.S. Cl.
  CPC ........ *G06F 3/0679* (2013.01); *G11C 11/5628* (2013.01); *G11C 16/0483* (2013.01); *G11C 16/24* (2013.01); *G11C 16/3454* (2013.01)

(58) Field of Classification Search
  CPC . G11C 29/50004; G11C 5/025; G11C 7/1039; G11C 16/3445; G11C 16/345; G11C 16/3468; G11C 16/3472; G11C 16/3477; G11C 2211/5642; G11C 2216/18; G11C 5/143; G11C 7/1048; G11C 7/18; G11C 8/14; H01L 2225/06506; H01L 2225/0651; H01L 2225/06517; H01L 2225/06562; H01L 2225/06565; H01L 2225/06568; H01L 25/0657; H01L 25/18
  USPC ............ 365/185.28, 185.18, 185.23, 185.17, 365/185.19, 185.11, 185.14, 185.24, 365/185.26
  See application file for complete search history.

(56) References Cited

U.S. PATENT DOCUMENTS

| | | |
|---|---|---|
| 9,286,987 B1 | 3/2016 | Dong et al. |
| 2020/0321058 A1 | 10/2020 | Lee et al. |

\* cited by examiner

| | | Temp (℃) | | | |
|---|---|---|---|---|---|
| | | -40 | 0 | 40 | 80 |
| DSL Initial Setup | 1 | 2.25 | 2.2 | 2.15 | 2.1 |

[B]

| | | Temp (℃) | | | |
|---|---|---|---|---|---|
| | | -40 | 0 | 40 | 80 |
| DSL OVD Level | 1 | 2.35 | 2.3 | 2.25 | 2.2 |

APPARATUS AND METHOD FOR PROGRAMMING DATA IN A NON-VOLATILE MEMORY DEVICE

CROSS-REFERENCE TO RELATED APPLICATIONS

This patent application claims the benefit of Korean Patent Application No. 10-2021-0083197, filed on Jun. 25, 2021, the entire disclosure of which is incorporated herein by reference.

BACKGROUND

Field of Invention

One or more embodiments described herein relate to an apparatus and a method for storing or programming data in a non-volatile memory device.

Description of Related Art

Recently, a paradigm for a computing environment has shifted to ubiquitous computing, which enables computer systems to be accessed virtually anytime and anywhere. As a result, the use of portable electronic devices (e.g., mobile phones, digital cameras, notebook computers, or the like) is rapidly increasing. Each of these devices may use or include a memory system having at least one memory device. The memory system may be a data storage device, which, for example, may be used as a main storage device or an auxiliary storage device.

Such a data storage device may include one or more non-volatile semiconductor memories that exhibit improved stability and durability, have no mechanical driving parts (e.g., a mechanical arm), and thus provide high data access speeds and relatively low power consumption. Examples of these types of data storage devices include, but are not limited to, Universal Serial Bus (USB) memory devices, memory cards having various interfaces, and solid state drives (SSDs).

BRIEF DESCRIPTION OF THE DRAWINGS

The description herein makes reference to the accompanying drawings wherein like reference numerals refer to like parts throughout the figures.

FIG. 12 illustrates an example of a table for controlling a drain select line (DSL).

DETAILED DESCRIPTION

Figure 1:
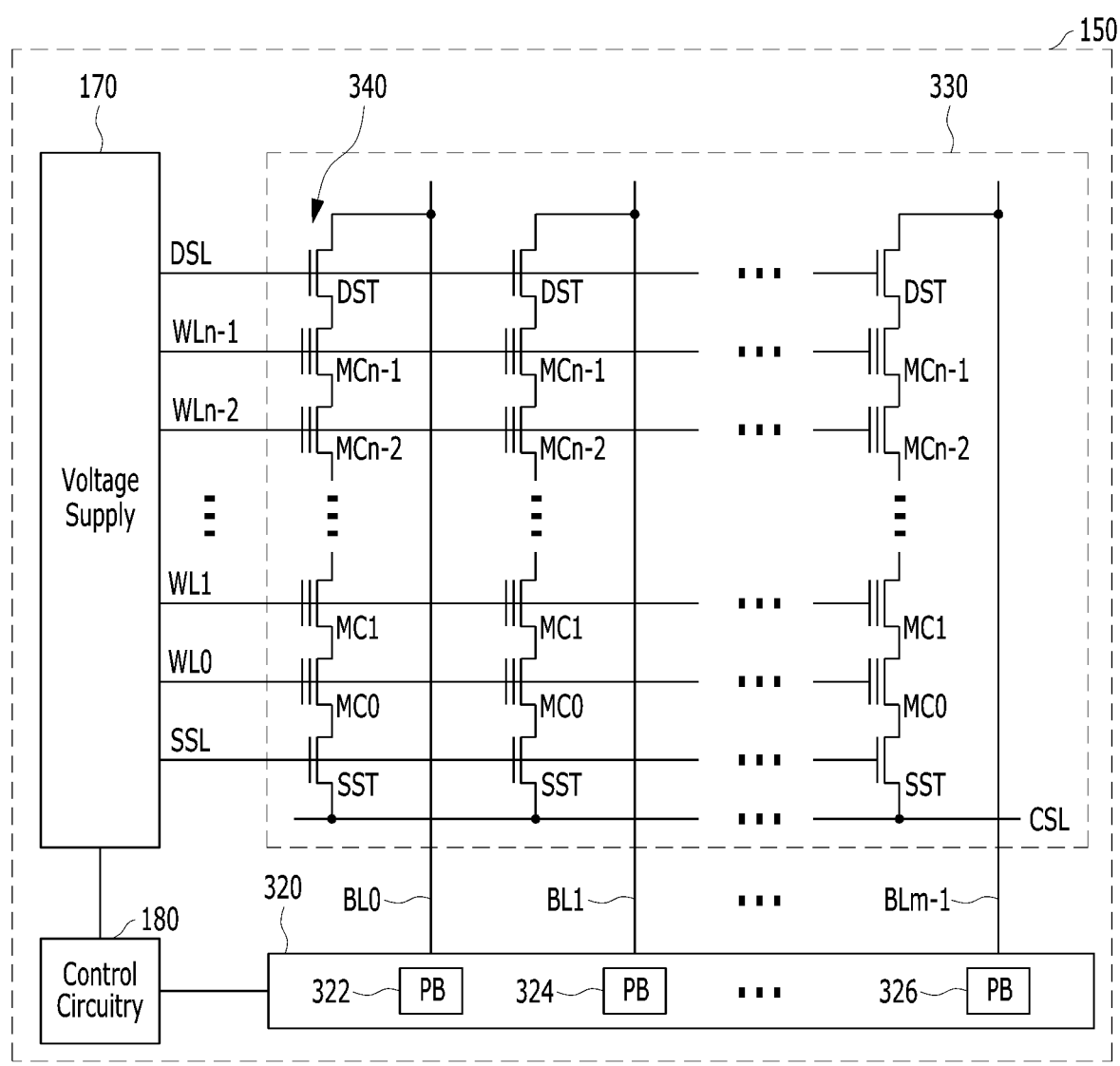
FIG. 1 illustrates an embodiment of a memory device.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language include hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or portion of a processor and its (or their) accompanying software and/or firmware. The term "circuitry" or "logic" also covers, for example, and if applicable to a particular claim element, an integrated circuit for a storage device.

As used herein, these terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Embodiments described herein provide a data processing system and a method for operating the data processing system. The data processing system includes components and resources such as a memory system and a host, and is capable of dynamically allocating plural data paths used for data communication between the components based on usages of the components and the resources.

Embodiments described herein also provide an apparatus and a method for improving data input/output speed of a memory device included in the data processing system. Further, according to one embodiment, the data input/output speed can be improved in a process of programming a data item in a non-volatile memory device.

In one embodiment, a memory device can include a memory structure including at least one non-volatile memory cell configured to store multi-bit data; and a control device configured to perform a program verification after a first program pulse is applied to the at least one non-volatile memory cell during a data program operation, the data program operation including applying a plurality of program pulses to program multi-bit data to the at least one non-volatile memory cell and the first program pulse being one of the plurality of program pulses, determine a program mode for the at least one non-volatile memory cell based on a result of the program verification, and change at least one of a level of a first control voltage.

The memory structure can include a first transistor coupled between the at least one memory cell and the bit line, the first transistor configured to operate in response to the first control voltage applied to the drain select line (DSL); a second transistor coupled between the at least one memory cell and a source line, the second transistor configured to operate in response to a first control voltage applied to a string select line (SSL). The at least one memory cell is coupled between the first transistor and the second transistor and is configured to store the multi-bit data through the plurality of program pulses.

The at least one memory cell can include N number of transistors serially connected to each other between the first transistor and the second transistor. The control device can program the multi-bit data to the at least one memory cell in an order of a transistor connected to the first transistor to another transistor connected to the second transistor, among the N number of transistors.

The control device can be configured to determine the level of the first control voltage in response to a temperature of the memory device, and determine whether the level of the first control voltage is changed or adjusted in response to a number of program pulses applied to the at least one non-volatile memory cell during the data program operation.

The control device can apply a program pulse and performs the program verification corresponding to the program pulse after determining the level of the first control voltage.

The control device can be configured to compare the number of program pulses applied to the at least one non-volatile memory cell during the data program operation with a predetermined number to change or adjust the level of the first control voltage and determine whether an overvoltage driving is applied in response to a comparison result.

The control device can decrease the level of the first control voltage by a predetermined level corresponding to the number of programming pulses applied to the at least one non-volatile memory cell during the data program operation.

The control device can avoid that the level of the first control voltage is lower than a minimum level for operating a transistor connected to the drain select line (DSL).

The program mode corresponding to the second program pulse can be determined as one selected from a first mode, a second mode, and a third mode. The first mode is for applying the second program pulse to change or adjust a threshold voltage of the at least one non-volatile memory cell by a first level which is equal to, or larger than, that caused by the first program pulse. The second mode is for applying the second program pulse to change or adjust the threshold voltage of the at least one non-volatile memory cell by a second level which is smaller than that caused by the first program pulse. The third mode is for applying the second program pulse to the at least one non-volatile memory cell of which a change of the threshold voltage is inhibited.

The control device can change the level of the first control voltage when the program mode is the second mode.

The control device can increase a level of a pass voltage applied to the memory structure, the level of the first control voltage applied to the drain select line (DSL), or a level of a second control voltage applied to a string select line (SSL).

In one embodiment, a memory system can include a memory device comprising plural non-volatile memory cells; and a controller configured to receive a write command and write data from a host, determine a location in which the write data is stored in the memory device, and transfer the write data to the memory device. During a data program operation of applying a plurality of program pulses to program the write data to the plural non-volatile memory cells, the memory device can be configured to determine a program mode causing a change of threshold voltages of the plural non-volatile memory cells, and change at least one of a level of a first control voltage.

The memory device can be configured to determine the level of the first control voltage in response to a temperature of the memory device, and determine whether the level of the first control voltage is changed or adjusted in response to a number of program pulses applied to the at least one non-volatile memory cell during the data program operation.

The memory device can be configured to compare the number of program pulses applied to the at least one non-volatile memory cell during the data program operation with a predetermined number to change or adjust the level of the first control voltage and determine whether an over-voltage driving is applied in response to a comparison result.

The program mode corresponding to the second program pulse is determined as one selected from a first mode, a second mode, and a third mode: the first mode for applying the second program pulse to change or adjust a threshold voltage of the at least one non-volatile memory cell by a first level which is equal to, or larger than, that caused by the first program pulse; the second mode for applying the second program pulse to change or adjust the threshold voltage of the at least one non-volatile memory cell by a second level which is smaller than that caused by the first program pulse; and the third mode for applying the second program pulse to the at least one non-volatile memory cell of which a change of the threshold voltage is inhibited. The memory device can be configured to change a potential of a bit line coupled to the plural non-volatile memory cells.

The memory device is configured to change a potential of a bit line coupled to the plural non-volatile memory cells.

The memory device can avoid that the level of the first control voltage is lower than a minimum level for operating a transistor connected to the drain select line (DSL).

The memory device can be configured to increase a level of a pass voltage applied to the memory structure, the level of the first control voltage applied to the drain select line (DSL), or a level of a second control voltage applied to a string select line (SSL).

In another embodiment, a memory system can include a memory device including a string arranged between a bit line and a common source line and coupled to a voltage supply circuit through a drain select line and at least one word line, the string including a drain select transistor and at least one memory cell in series, the drain select transistor coupled to the drain select line, the memory cell coupled to the word line; and a controller coupled to the memory device and configured to control the memory device to perform a program operation on the memory cell, the program operation including a plurality of program loops. The voltage supply circuit can increase a level of a set control voltage to be applied to the drain select line in one or more initial periods among the plurality of program loops.

The level of the set control voltage can be determined in response to a temperature of the memory device or a number of the plurality of program loops.

Embodiments will now be described with reference to the accompanying drawings, wherein like numbers reference like elements.

FIG. 1 illustrates an embodiment of a memory device 150 that includes a memory cell array circuit formed in a memory die.

Referring to FIG. 1, the memory device 150 may include at least one memory group 330 having a plurality of cell strings 340. Each cell string 340 may include a plurality of non-volatile memory cells MC0 to MCn−1 connected to a respective one of a plurality of bit lines BL0 to BLm−1. The cell strings 340 are disposed in respective columns of the memory group 330, and each cell string 340 can include at least one drain select transistor DST and at least one source select transistor SST. The non-volatile memory cells MC0 to MCn−1 of each cell strong 340 may be connected in series between a drain select transistor DST and a source select transistor SST. Each of the non-volatile memory cells MC0 to MCn−1 may be configured as a multi-level cell (MLC) that stores a data item having plural bits per cell. The cell strings 340 may be electrically connected to corresponding ones of the bit lines BL0 to BLm−1.

In one embodiment, the memory group 330 may include NAND-type flash memory cells MC0 to MCn−1. In another embodiment, the memory group 330 can be implemented as a NOR-type flash memory, a hybrid flash memory (in which at least two different types of memory cells are mixed or combined), or a one-chip NAND flash memory in which a controller is embedded in a single memory chip. In one embodiment, the memory group 330 can include a flash memory cell including a charge trap flash (CTF) layer that includes a conductive floating gate or insulating layer.

Figure 2:
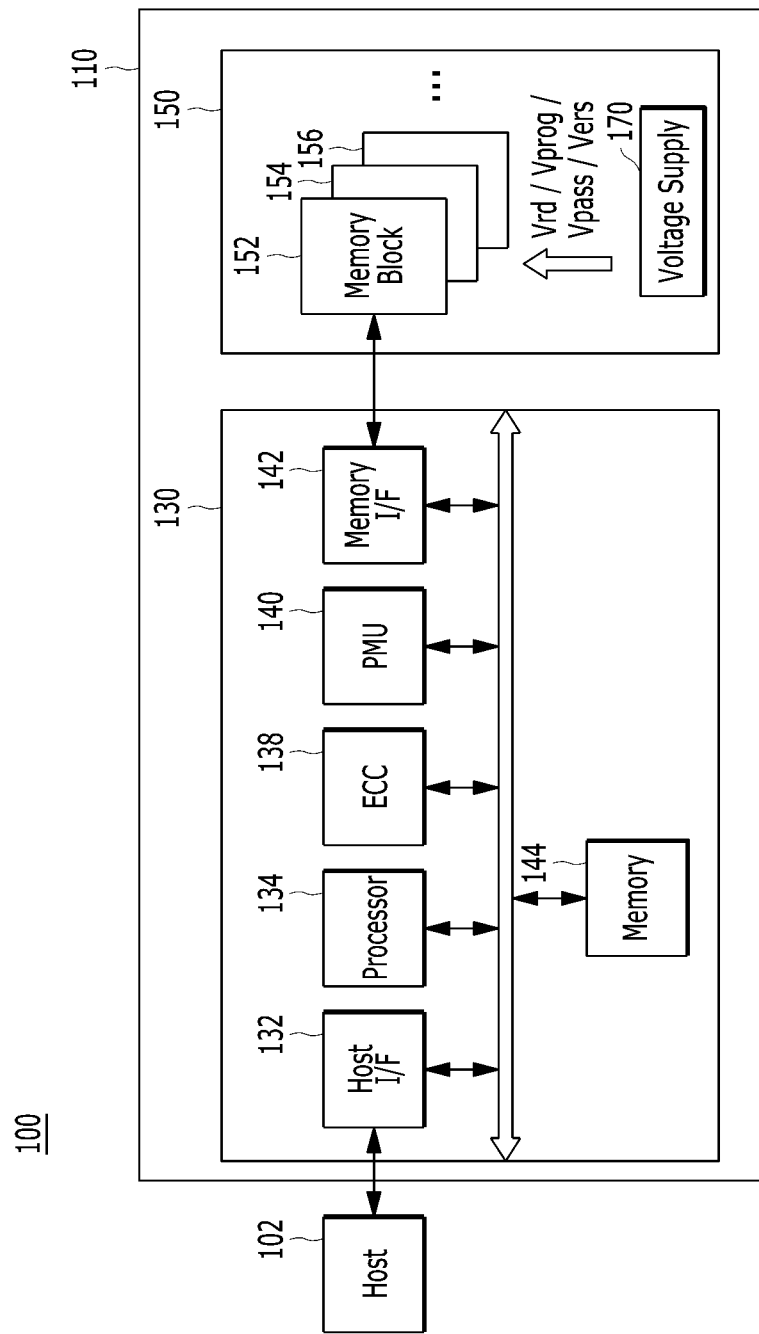
FIG. 2 illustrates an embodiment of a data processing system.

FIG. 2 shows an embodiment of a memory system 110 which may include the memory device 150. In this embodiment, the memory group 330 in memory device 150 may include one or more memory blocks 152, 154, 156. According to an embodiment, the memory device 150 can have a two-dimensional (2D) or three-dimensional (3D) structure. For example, each of the memory blocks 152, 154, 156 in the memory device 150 may be implemented as a 3D structure (or a vertical structure). Each of the memory blocks 152, 154, 156 may have a three-dimensional structure extending along first to third directions, for example, an x-axis direction, a y-axis direction, and a z-axis direction.

The memory group 330 including the plurality of memory blocks 152, 154, 156 can be coupled to a plurality of bit lines BL, a plurality of string select lines SSL, and a plurality of drain select lines DSL, a plurality of word lines WL, a plurality of dummy word lines DWL, and a plurality of common source lines CSL. In one embodiment, the memory group 330 can include a plurality of NAND strings NS (which, for example, may respectively correspond to cell strings 340). Each NAND string NS may include a plurality of memory cells MC and may be connected to a respective one of the bit lines BL. In addition, the string select transistor SST of each NAND string NS may be connected to a common source line CSL, and the drain select transistor DST of each NAND string NS can be connected to a corresponding bit line BL. In each NAND string NS, the memory cells MC may be arranged between the string select transistor SST and the drain select transistor DST.

Referring to FIGS. 1 and 2, the memory device 150 may include a voltage supply circuit 170 which can supply a word line voltage (e.g., one or more predetermined voltages such as a program voltage, a read voltage, and a pass voltage) for respective ones of the word lines according to an operation mode, or may supply a voltage to a bulk (e.g., a well region) in which each memory block including the memory cells MC are formed. In this case, a voltage generating operation of the voltage supply circuit 170 may be performed under a control of a control circuitry 180. Also, the voltage supply circuit 170 may generate a plurality of variable read voltages to distinguish a plurality of data items from each other.

In response to the control of the control circuit, one of the memory blocks (or sectors) of the memory cell array may be selected, and one of the word lines of the selected memory block may be selected. Word line voltages may be supplied to the selected word line and the unselected word line, individually. The voltage supply circuit 170 may include a voltage generation circuit (e.g., refer to FIGS. 4 to 8) for generating target voltages having various levels.

In one embodiment, the voltage supply circuit 170 may be coupled to a first pin or pad receiving a first power voltage VCC applied from the outside (e.g., an external device) and a second pin or pad receiving the second power voltage VPP applied from the external device. The second power voltage VPP may have a greater voltage level than (e.g., twice or more higher than) that of the first power voltage VCC. For example, the first power voltage VCC may have a voltage level of 2.0V to 5.5V, while the second power supply voltage may have a voltage level of 9V to 13V.

According to an embodiment, the voltage supply circuit 170 can include a voltage generation circuit for more rapidly generating the target voltages of various levels used in the memory group 330. The voltage generation circuit can use the second power supply voltage VPP to generate a target voltage, which may have a higher voltage level than the second power voltage VPP.

The memory device 150 may also include a read/write circuit 320 controlled by the control circuitry 180. The read/write circuit 320 may operate as a sense amplifier or a write driver according to an operation mode. For example, in a verify operation and a read operation, the read/write circuit 320 may operate as a sense amplifier for reading the data item from the memory cell array. In a program operation, the read/write circuit 320 may operate as a write driver that controls potentials of bit lines according to a data item to be stored in the memory cell array. The read/write circuit 320 may receive the data item to be programmed to the cell array from page buffers during the program operation. The read/write circuit 320 can drive bit lines based on the input data item. To this end, the read/write circuit 320 may include a plurality of page buffers (PB) 322, 324, 326, with each page buffer corresponding to each column (or each bit line) or each column pair (or each bit line pair). According to an embodiment, a plurality of latches may be included in each of the page buffers 322, 324, 326.

The page buffers 322, 324, 326 may be coupled to a data input/output device (e.g., a serialization circuit or a serializer) through a plurality of buses BUS. When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without a waiting time.

According to an embodiment, the memory device 150 may receive a write command, write data, and information (e.g., a physical address) regarding a location in which the write data is to be stored. The control circuitry 180 causes the voltage supply circuit 170 to generate a program pulse, a pass voltage, etc., used for a program operation performed in response to a write command, and to generate one or more voltages used for a verification operation performed after the program operation.

When a multi-bit data item is programmed in non-volatile memory cells included in the memory group 330, the error rate might be higher than that when a single-bit data item is stored in the non-volatile memory cells. For example, an error in the non-volatile memory cells may be induced due to cell-to-cell interference (CCI). In order to reduce error in the non-volatile memory cells, a width (deviation) of a threshold voltage distribution (corresponding to stored data items between the non-volatile memory cells) should be reduced.

To this end, the memory device 150 can perform an incremental step pulse programming (ISPP) operation to effectively make a narrow threshold voltage distribution of the non-volatile memory cells. In one embodiment, the memory device 150 can use the ISPP operation for multi-step program operations. For example, the memory device 150 may divide a program operation into a Least Significant Bit (LSB) program operation and a Most Significant Bit (MSB) operation according to a predetermined order between the non-volatile memory cells or pages.

According to an embodiment, it is possible to provide an apparatus and method which is capable of reducing a time for discharging a bit line or a channel between program pulse applications during a data programming operation accomplished by applying a plurality of program pulses to memory cells in a memory device. When a discharge time could be reduced, the speed of the program operation of the memory device may be increased. For example, in order to discharge a bit line or a channel in the memory device, the memory device can control or adjust the voltage level of a bit line select line or a drain select line (DSL), in order to avoid that a transistor is in a floating state when controlled through the bit line select line or the drain select line (DSL). Because the transistor might be in the floating state, the bit line or channel could not be discharged appropriately.

In an embodiment, a memory device can adjust and change a setup time for adjusting a potential of a bit line after applying a program pulse during a unit programming operation in which a program pulse to memory cell is applied to a non-volatile memory cell in the memory device. As a result, it is possible to provide an apparatus and method that is capable of increasing the speed of the program operation and/or improving program operation efficiency.

For example, during an operation of applying a plurality of program pulses to non-volatile memory cells in the memory device (in order to program the non-volatile memory cells with multi-bit data), the memory device can perform a unit program operation in which a second program pulse is applied after a first program pulse have been applied, in one of various modes.

The modes of the unit program operation can include a first program mode, a second program mode, and a third program mode. In the first program mode, the degree to which data is programmed in response to the second program pulse (e.g., a change or a shift of threshold voltage in a non-volatile memory cell when the second program pulse is applied) may be similar to or greater than the degree to which data is programmed in response to the first program pulse. In the second program mode, the degree to which data is programmed in response to the second program pulse is smaller than the degree to which data is programmed in response to the first program pulse. In the third program mode, the degree to which data is programmed in response to the second program pulse is non-existent (e.g., there is no change or no shift of the threshold voltage in the non-volatile memory cell even when the second program pulse is applied). The mode could be achieved based on a potential of the bit line coupled to a target memory cell when a program pulse is applied. If the discharge time could be reduced, the memory device can improve the efficiency or speed of the data program operation by adjusting and changing the setup time used to change or discharge the potential of the bit line.

According to an embodiment, the memory device can change or adjust a control voltage applied through the bit line select line or the drain select line (DSL) in response to a program operation environment (e.g., temperature) and a level (or size) or a number of applications regarding a program pulse applied to non-volatile memory cells during the data program operation. Accordingly, the memory device may reduce an operation margin corresponding to each program pulse during the data programming operation by applying a plurality of program pulses to a non-volatile memory cell. This may reduce the time spent on performing the data programming operation.

Referring again to FIG. 2, the memory device 150 is shown as included in a data processing system 100. According to an embodiment, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include the memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements that are functionally divided. Further, according to an embodiment, the memory device 150 and the controller 130 may be implemented in a single chip or in a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

In FIG. 2, the memory device 150 may include one or more memory blocks 152, 154, 156. The memory block 152, 154, 156 may be understood as a group of non-volatile memory cells in which data is removed together by a single erase operation. The memory block 152, 154, 156 may include at least one page, e.g., a group of non-volatile memory cells that store data together during a single program operation and/or that output data together during a single read operation. For example, one memory block may include a plurality of pages.

In one embodiment, the memory device 150 may include a plurality of memory planes or one or more memory dies. According to an embodiment, the memory plane may be considered a logical or a physical partition including at least one memory block, a driving circuit capable of controlling an array of a plurality of non-volatile memory cells, and a buffer that can temporarily store data input to, or output from, non-volatile memory cells.

According to an embodiment, each memory die may include at least one memory plane and may be understood as a set of components implemented on a physically distinguishable substrate. Each memory die may be connected to the controller 130 through a data path, and may include an interface to exchange an item of data and a signal with the controller 130.

According to an embodiment, the memory device 150 may include at least one memory block 152, 154, 156, at least one memory plane, or at least one memory die. The internal configuration of the memory device 150 (e.g., shown in FIG. 1) may be different according to performance of the memory system 110. An embodiment of the present disclosure is not limited to the internal configuration shown in FIG. 2.

In FIG. 2, the memory device 150 includes the voltage supply circuit 170 which is capable of supplying one or more voltages to the memory block(s) 152, 154, 156. The voltage supply circuit 170 can include a voltage generation circuit for generating target voltages for the memory block(s) 152, 154, 156, for example, as explained with reference to FIGS. 4 to 8.

In one embodiment, the voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell in the memory block(s) 152, 154, 156, the voltage supply circuit 170 may supply the read voltage Vrd to a selected non-volatile memory cell. During the program operation for storing data in the non-volatile memory cell in the memory block(s) 152, 154, 156, the voltage supply circuit 170 may supply the program voltage Vprog into a selected non-volatile memory cell. During a read operation or a program operation performed on the selected non-volatile memory cell, the voltage supply circuit 170 may supply a pass voltage Vpass to a non-selected non-volatile memory cell. During the erasing operation for erasing data stored in the non-volatile memory cell in the memory block(s) 152, 154, 156, the voltage supply circuit 170 may supply the erase voltage Vers to the memory block.

The memory device 150 may store information regarding various voltages which are supplied to the memory block(s) 152, 154, 156 based on which operation is performed. For example, when a non-volatile memory cell in the memory block(s) 152, 154, 156 can store multi-bit data, plural levels of the read voltage Vrd for recognizing or reading the multi-bit data item may be used. The memory device 150 may include a table with information indicating plural levels of the read voltage Vrd corresponding to the multi-bit data item. For example, the table can include bias values stored in a register, with each bias value corresponding to a specific level of the read voltage Vrd. The number of bias values for the read voltage Vrd that is used for a read operation may be limited to a preset range. Also, in one embodiment, the bias values can be quantized.

The host 102 may include a portable electronic device (e.g., a mobile phone, an MP3 player, a laptop computer, etc.) or a non-portable electronic device (e.g., a desktop computer, a game player, a television, a projector, etc.). According to an embodiment, the host 102 can include a central processing unit (CPU) included in the portable electronic device and the non-portable electronic device.

The host 102 may include at least one operating system (OS), which can control functions and operations performed in the host 102. The OS can provide interoperability between the host 102 engaged operatively with the memory system 110 and a user who intends to store data in the memory system 110. The OS may support functions and operations corresponding to user requests. By the way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility (e.g., a power saving function). The host 102 may include a plurality of operating systems. The host 102 may execute multiple operating systems interlocked with the memory system 110, corresponding to a user request. The host 102 may transmit a plurality of commands corresponding to user requests to the memory system 110, thereby performing operations corresponding to the plurality of commands within the memory system 110.

The controller 130 may control the memory device 150 in response to a request or a command from the host 102. For example, the controller 130 may perform a read operation to provide data read from the memory device 150 to the host 102 and may perform a write operation (or a program operation) to store data input from the host 102 in the memory device 150. In order to perform data input/output (I/O) operations, the controller 130 may control and manage internal operations of reading data, programming data, erasing data, or the like.

According to an embodiment, the controller 130 may include a host interface (I/F) 132, a processor 134, error correction circuitry (ECC) 138, a power management unit (PMU) 140, a memory interface (I/F) 142, and a memory 144. Components in the controller 130 as illustrated in FIG. 2 may vary according to structures, functions, operation performance, or the like, regarding the memory system 110.

For example, the memory system 110 may be implemented with any of various types of storage devices (electrically coupled with the host 102) according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to implementation of the memory system 110.

Each of the host 102 and the memory system 110 may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 may receive signals, commands (or requests), and/or data input from the host 102. For example, the host 102 and the memory system 110 may use a predetermined protocol to transmit and receive data therebetween. Examples of communication standards, protocols or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by, firmware called a host interface layer (HIL).

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide high transmission speed compared with other interfaces such as IDE and SATA. In the SCSI, the host 102 and at least one peripheral device (e.g., memory system 110) are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In SAS, the host 102 and a plurality of peripheral devices are connected in series, and data transmission and reception between the host 102 and each peripheral device may be performed in a serial data communication scheme. Also, SAS can support connection between the host 102 and the peripheral device through a serial cable instead of a parallel cable, to easily manage equipment using the SAS and enhance or improve operational reliability and communication performance. Also, SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. PCIe can use a slot or a specific cable for connecting a computing device (e.g., host 102) and a peripheral device (e.g., memory system 110). For example, PCIe can use a plurality of pins (e.g., 18 pins, 32 pins, 49 pins, or 82 pins) and at least one wire (e.g., ×1, ×4, ×8, or ×16) to achieve high speed data communication over several hundred MB per second (e.g., 250 MB/s, 500 MB/s, 984.6250 MB/s, or 1969 MB/s). According to an embodiment, a PCIe scheme may achieve bandwidths of tens to hundreds of Giga bits per second. NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices, e.g., a keyboard, a mouse, a joystick, a printer, a scanner, a storage device, a modem, a video camera, and the like. A plurality of peripheral devices such as the memory system 110 may be coupled to a single transceiver included in the host 102.

The error correction circuitry 138 can correct error bits of data read from the memory device 150, and may include an error correction code (ECC) encoder and an ECC decoder. The ECC encoder may perform error correction encoding of data to be programmed in the memory device 150 in order to generate encoded data into which a parity bit is added. The encoded data may be stored in memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not and outputs an instruction signal (e.g., a correction success signal or a correction fail signal) based on a result of the error correction decoding. The error correction circuitry 138 may use a parity bit (generated during the ECC encoding process for the data stored in the memory device 150) in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on coded modulation. Examples include a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes. In one embodiment, the error correction circuitry 138 can include at least some of components in the controller 130 shown in FIG. 1.

The ECC decoder may perform hard decision decoding or soft decision decoding on data transmitted from the memory device 150. Hard decision decoding can be understood as one of two methods broadly classified for error correction. Hard decision decoding may include, for example, an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

Soft decision decoding may quantize a threshold voltage of a non-volatile memory cell in the memory device 150 by two or more quantized values (e.g., multiple bit data, approximate values, an analog value, and the like) in order to correct an error bit based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. A low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. Hard decision decoding (in which a value output from a non-volatile memory cell) is coded as 0 or 1.

Compared to hard decision decoding, soft decision decoding can determine the value stored in the non-volatile memory cell based on the stochastic information. Regarding bit-flipping (which may be considered an error that can occur in the memory device 150), soft decision decoding may provide improved probability of correcting the error and recovering data, as well as providing reliability and stability of corrected data. The LDPC-GM code may have a scheme in which internal low-density generator matrix (LDGM) codes can be concatenated in series with high-speed LDPC codes.

According to an embodiment, the ECC decoder may use, for example, low-density parity-check convolutional codes (LDPC-CCs) for the soft decision decoding. The LDPC-CCs may correspond to a scheme using a linear time encoding and a pipeline decoding based on a variable block length and a shift register.

According to an embodiment, the ECC decoder may use, for example, a Log Likelihood Ratio Turbo Code (LLR-TC) for soft decision decoding. A Log Likelihood Ratio (LLR) may be calculated as a non-linear function for a distance between a sampled value and an ideal value. In addition, a Turbo Code (TC) may include a simple code (for example, a Hamming code) in two or three dimensions and repeat decoding in a row direction and a column direction to improve reliability of values.

The power management unit (PMU) 140 may control electrical power provided to the controller 130. The PMU 140 may monitor the electrical power supplied to the memory system 110 (e.g., a voltage supplied to the controller 130) and provide the electrical power to components included in the controller 130. The PMU 140 may not only detect power-on or power-off, but may also generate a trigger signal to enable the memory system 110 to urgently back up a current state when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. When the memory device 150 is a flash memory, the memory interface 142 may generate a control signal for the memory device 150 and may process data input to, or output from, the memory device 150 under the control of the processor 134.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102.

In addition, the controller 130 may temporarily store write data input from the host 102 in the memory 144 before programming the write data in the memory device 150. When the controller 130 controls operations such as a data read operation, a data write or program operation, a data erase operation, etc., of the memory device 150, data transmitted between the controller 130 and the memory device 150 of the memory system 110 may be temporarily stored in the memory 144.

In addition to the read data or write data, the memory 144 may store information (e.g., map data, read requests, program requests, etc.) used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates that the memory 144 disposed within the controller 130, embodiments are not limited thereto. The memory 144 may be located within or external to the controller 130. For instance, the memory 144 may be embodied by an external volatile memory having a memory interface for transferring data and/or signals between the memory 144 and the controller 130.

The processor 134 may control overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. The firmware may be, for example, a flash translation layer (FTL). According to an embodiment, the processor 134 may be implemented with a microprocessor, a central processing unit (CPU), or another processing device.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. Examples of background operations that may be performed without a command transmitted from the host 102, the controller 130 can perform garbage collection (GC), wear leveling (WL), bad block management for identifying and processing bad blocks, or the like.

According to an embodiment, substantially similar operations may be performed as both the foreground operation and the background operation. For example, when the memory system 110 performs garbage collection in response to a request or a command input from the host 102 (e.g., manual GC), the garbage collection can be considered a foreground operation. When the memory system 110 performs garbage collection independently of the host 102 (e.g., auto GC), the garbage collection can be considered a background operation.

When the memory device 150 includes a plurality of dies (or a plurality of chips) each including a plurality of non-volatile memory cells, the controller 130 may perform parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered as an interleaving method. Because a data input/output speed of the memory system 110 increases by operating with the interleaving method, data I/O performance of the memory system 110 can be improved.

By way of example but not limitation, the controller 130 can recognize statuses of a plurality of channels (or ways) associated with the plurality of dies included in the memory device 150. The controller 130 may determine a status of each channel or each way as one of a busy status, a ready status, an active status, an idle status, a normal status, and an abnormal status. The determination of which channel or way an instruction (and/or a data) is delivered through by the controller 130 can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel (s) or way(s) is used to exchange an instruction or data.

As above described, the memory device 150 in the memory system 110 may include one or more memory blocks 152, 154, 156. Each of the memory blocks 152, 154, 156 includes a plurality of non-volatile memory cells. According to an embodiment, the memory blocks 152, 154, 156 can be a group of non-volatile memory cells erased together. The memory blocks 152, 154, 156 may include a plurality of pages which is a group of non-volatile memory cells read or programmed together.

In one embodiment, each of the memory blocks 152, 154, 156 may have a three-dimensional stack structure for high integration. Further, the memory device 150 may include a plurality of dies, each die including a plurality of planes, each plane including the memory blocks 152, 154, 156. A configuration of the memory device 150 may be changed depending on performance of the memory system 110.

In FIG. 2, the memory device 150 includes memory blocks 152, 154, and 156 which may be any of single-level cell (SLC) memory blocks, multi-level cell (MLC) memory blocks, or the like, based on the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, with each memory cell storing multi-bit data (e.g., two or more bits of data). The MLC memory block may have larger storage capacity for the same space compared to the SLC memory block. The MLC memory block can be highly integrated in view of storage capacity.

In an embodiment, the memory device 150 may be implemented with MLC memory blocks such as a double level cell (DLC) memory block, a triple-level cell (TLC) memory block, a quadruple-level cell (QLC) memory block, and a combination thereof. A DLC memory block may include a plurality of pages implemented by memory cells, with each memory cell capable of storing 2-bit data. A TLC memory block can include a plurality of pages implemented by memory cells, with each memory cell capable of storing 3-bit data. A QLC memory block can include a plurality of pages implemented by memory cells, with each memory cell capable of storing 4-bit data. In another embodiment, the memory device 150 can be implemented with a block including a plurality of pages implemented by memory cells, with each memory cell capable of storing five or more bits of data.

According to an embodiment, the controller 130 may use an MLC memory block included in the memory device 150 as an SLC memory block that stores one-bit data in one memory cell. A data input/output speed of the multi-level cell (MLC) memory block can be slower than that of the SLC memory block. For example, when the MLC memory block is used as the SLC memory block, the margin for a read or program operation can be reduced. For example, the controller 130 may perform a data input/output operation with a higher speed when the MLC memory block is used as the SLC memory block. Thus, the controller 130 may use the MLC memory block as a SLC buffer to temporarily store data because the buffer may require a high data input/output speed for improving performance of the memory system 110.

According to an embodiment, the controller 130 can program data in an MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For an MLC overwrite operation, the controller 130 may store the number of program times as separate operation information when 1-bit data is programmed in an MLC. According to an embodiment, an operation for uniformly levelling threshold voltages of the MLCs may be carried out before another 1-bit data is programmed in the same MLCs, each having stored another-bit data.

In an embodiment, the memory device 150 is embodied as a non-volatile memory such as a flash memory, for example, as a NAND flash memory, a NOR flash memory, or the like. In another embodiment, the memory device 150 may be implemented by at least one of a phase change random access memory (PCRAM), a ferroelectrics random access memory (FRAM), a spin transfer torque random access memory (SU-RAM), and a spin transfer torque magnetic random access memory (STT-MRAM), or the like.

Figure 3A:
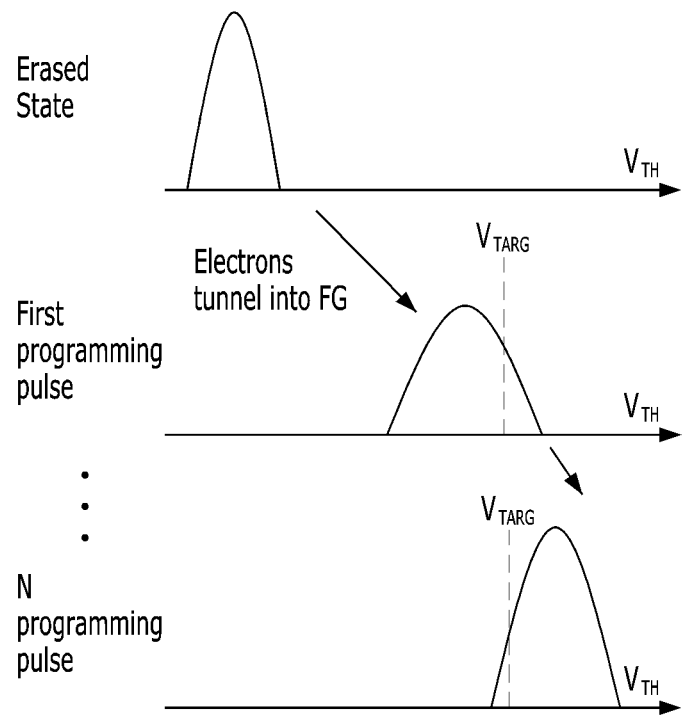
FIGS. 3A and 3B illustrate an embodiment of an Incremental Step Pulse Programming (ISPP) operation.
Figure 3B:
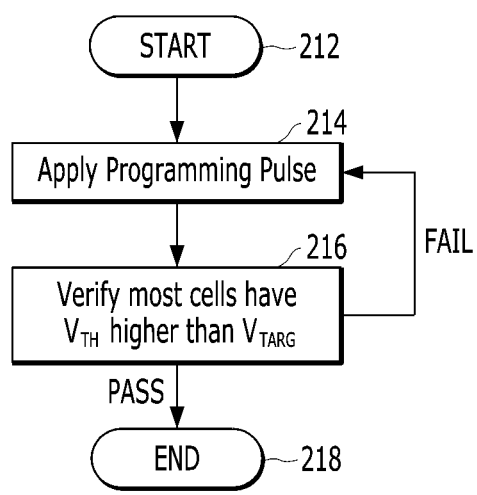

FIGS. 3A and 3B illustrate an embodiment of an Incremental Step Pulse Programming (ISPP) operation.

Referring to FIG. 3A, data may be programmed in a non-volatile memory cell that is in an erased state. When a programming pulse is supplied to a word line coupled to the non-volatile memory cell, the threshold voltage distribution of the non-volatile memory cell may shift from the erased state to the right (e.g., a direction in which the threshold voltage increases). If the programming pulse is continuously supplied to the non-volatile memory cell, the threshold voltage distribution of the non-volatile memory cell may continuously shift to the right. The programming pulse may be supplied until most of the plurality of non-volatile memory cells have a threshold voltage higher than the target voltage $V_{TARG}$ in a threshold voltage distribution.

In FIG. 3B, when a program operation starts (operation 212), the memory device 150 can apply a programming pulse to a plurality of non-volatile memory cells to be programmed with data (operation 214). After a programming pulse is applied, the memory device 150 can verify whether most of the plurality of non-volatile memory cells have a threshold voltage $V_{TH}$ higher than the target voltage $V_{TARG}$ (operation 216). When it is determined that most of the plurality of non-volatile memory cells do not have a threshold voltage $V_{TH}$ higher than the target voltage $V_{TARG}$ according to a verification result FAIL, the memory device 150 applies another programming pulse to the corresponding non-volatile memory cells (operation 214). When most of the plurality of non-volatile memory cells have a threshold voltage $V_{TH}$ higher than the target voltage $V_{TARG}$ according to another verification result PASS, the memory device 150 may end the program operation (operation 218).

In order to narrow the threshold voltage distribution of the plurality of non-volatile memory cells, it is advantageous to slightly shift (e.g., by a first amount) the threshold voltage distribution of the plurality of non-volatile memory cells to the right rather than greatly shifting them (e.g., by a second amount greater than the first amount) to the right when a single programming pulse is applied. On the other hand, when the threshold voltage distribution of the plurality of non-volatile memory cells is slightly shifted to the right, the number of times the programming pulse is applied may increase.

According to an embodiment, three times or more than the number of bits of data may be stored in the non-volatile memory cell. For example, when 2 bits of data can be stored in a non-volatile memory cell, the non-volatile memory cell may have four programmed states (e.g., '00', '01', '10', and 11') corresponding to 2-bit data. In order to form a tighter threshold voltage distribution (e.g., a narrower distribution), a degree to which the threshold voltage distribution of a plurality of non-volatile memory cells is shifted to the right, in response to a single programming pulse, can be smaller than a difference in two adjacent programmed states. For example, when two or more programming pulses are applied, it can be designed to move by a difference between two adjacent programmed states. In this case, the number of times of applying the programming pulse may be 8 times or more, which is more than 4 times than the number of bits of data.

According to an embodiment, the degree to which the threshold voltage distribution of the plurality of non-volatile memory cells moves when a single programming pulse is applied may be understood as a target level. An example of the target level is described in greater detail for the embodiment of FIG. 6.

Figure 4:
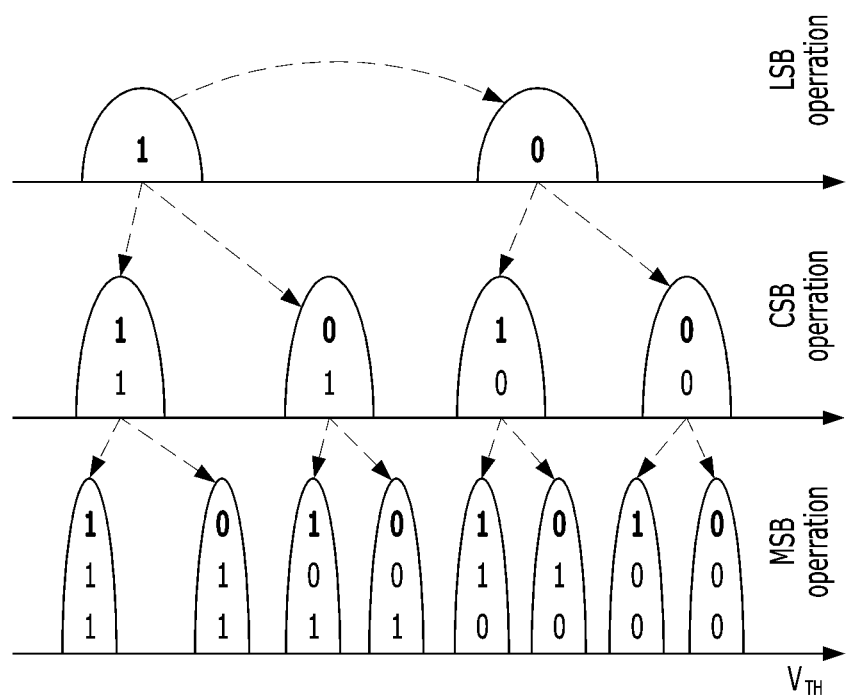
FIG. 4 illustrates an embodiment of a method for storing multi-bit data in a non-volatile memory cell.

FIG. 4 illustrates an embodiment of a method for storing multi-bit data in a non-volatile memory cell. The method of FIG. 4 may include a program operation performed in the memory device 150 including non-volatile memory cells, each capable of storing 3-bit data.

Data stored in the non-volatile memory cell may be distinguishable based on a level of threshold voltage $V_{TH}$ of the corresponding memory cell. The threshold voltage $V_{TH}$ of the memory cell can vary depending on a quantity of electrons or charges injected into a floating gate of the corresponding memory cell. A single-level cell SLC may be divided into two ranges of the threshold voltage $V_{TH}$, to store 1-bit data of "0" or "1". On the other hand, a triple-level cell TLC in the memory device 150 may have eight threshold voltage ranges.

Referring to FIG. 4, in order to reduce the number of applications of programming pulses in an incremental step pulse programming (ISPP) operation, the application of program pulses applied to the triple level cell TLC in response to bits of data stored in the triple level cell TLC can be controlled differently. Data stored in the triple-level cell TLC can be divided into LSB data, CSB data, and MSB data. In a process of programming the LSB data, the number of times of applying the programming pulses may be the smallest, and the number of times of applying the programming pulses in a process of programming the CSB data may be greater than that of programming the LSB data. In a process of programming the MSB data, the number of times of applying the programming pulses can be the largest.

In a memory device including a triple-level cell (TLC), each physical page may be divided into three logical pages that are an LSB page, a CSB page, and an MSB page. A programming pulse applied to each page can be different. For example, shifts of different positive threshold voltage ($V_{TH}$) distributions may be induced in processes of programming the LSB, CSB, and MSB data. In one embodiment, the threshold voltages $V_{TH}$ of the plurality of non-volatile memory cells can move the most in the process of programming the LSB page, and the threshold voltages $V_{TH}$ of the plurality of non-volatile memory cells can move the least in a process of programming the MSB page. According to an embodiment, when the number of times a programming pulse is applied in the process of programming the LSB page is the least, delay time can be the shortest and power consumption can also be the smallest. On the other hand, in the process of programming the MSB page, the number of times that the programming pulse is applied may increase so that the delay time and the power consumption can be increased.

Figure 5:
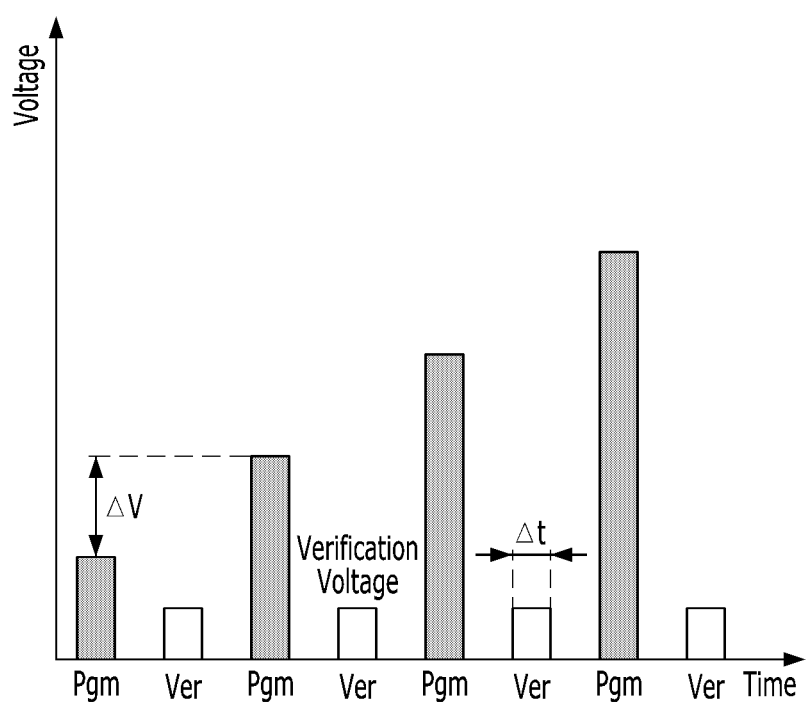
FIG. 5 illustrates an embodiment of a program operation and a verification operation of the Incremental Step Pulse Programming (ISPP) operation.

FIG. 5 illustrates an embodiment of a program voltage application operation and a verification operation of the ISPP operation.

Referring to FIG. 5, after the program voltage application operation Pgm is performed during the ISPP operation, the memory device 150 performs a verification operation Ver corresponding to the program voltage application operation Pgm. Each program voltage application operation Pgm can increase the threshold voltage $V_{TH}$ of the non-volatile memory cell. For example, each program voltage application operation Pgm increases the threshold voltage $V_{TH}$ of the non-volatile memory cell by the first potential difference $\Delta V$.

After the program voltage application operation Pgm is performed, the threshold voltage $V_{TH}$ of the non-volatile memory cell may be compared with a verification voltage in the verification operation. When the threshold voltage $V_{TH}$ of the non-volatile memory cell is lower than the verification voltage, the next program voltage application operation Pgm may be performed again to add more electrons into a floating gate of the non-volatile memory cell. Thereafter, the verification operation Ver is performed in response to the corresponding program voltage application operation Pgm. The repeated program voltage application operation Pgm may be performed until the threshold voltage $V_{TH}$ of the non-volatile memory cell reaches a target voltage (e.g., a verification voltage).

According to an embodiment, the number of repetitions of the program voltage application operation Pgm and the verification operation Ver may vary depending on a standby time or delay time, power consumption, accuracy, and the like. When the threshold voltage $V_{TH}$ of the non-volatile memory cell is finely increased through the program voltage application operation Pgm, accuracy of the program voltage application operation can be increased. However, delay time and power consumption can be longer and greater as a greater number of program voltage application operations can be performed. On the other hand, when the threshold voltage $V_{TH}$ of the non-volatile memory cell is greatly increased through each program voltage application operation Pgm, power consumption and operation time of the program voltage application operation Pgm may be increased and shorter. The operation times Δt of the program voltage application operation Pgm and the verify operation Ver may vary according to a goal of each program voltage application operation Pgm (e.g., a change of the threshold voltage $V_{TH}$).

Referring to FIGS. 4 and 5, in a memory device including a triple-level non-volatile memory cell TLC, the program voltage application operation Pgm and the verify operation Ver may be differently performed based on purpose and procedure of programming data in the least significant bit LSB, the center significant bit CSB and the most significant bit MSB of the memory cell. In FIG. 4, a memory device including a triple level non-volatile memory cell TLC has been described as an example, but the above-described program operation can also be applied to a memory device including a quadruple level non-volatile memory cell (QLC) for storing 4-bit data or a non-volatile memory cell capable of storing 5 or more-bit data.

According to an embodiment, for each program loop during the ISPP operation, a voltage level of the program pulse applied to the non-volatile memory cell in the program voltage application operation Pgm may be gradually increased by a preset voltage ΔV. However, a voltage level of the verification pulse applied to the non-volatile memory cell in the verification operation Ver corresponding to the program voltage application operation Pgm may be substantially the same (e.g., not changed). In the verification operation Ver for each program loop, substantially the same verification pulse is applied to the non-volatile memory cell, but the time Δt for applying the verification pulse may vary. When the verification operation is performed by reflecting a noise generated according to operating characteristics of the memory device 150, the memory device 150 may change or adjust a voltage level of the verification pulse.

Figure 6:
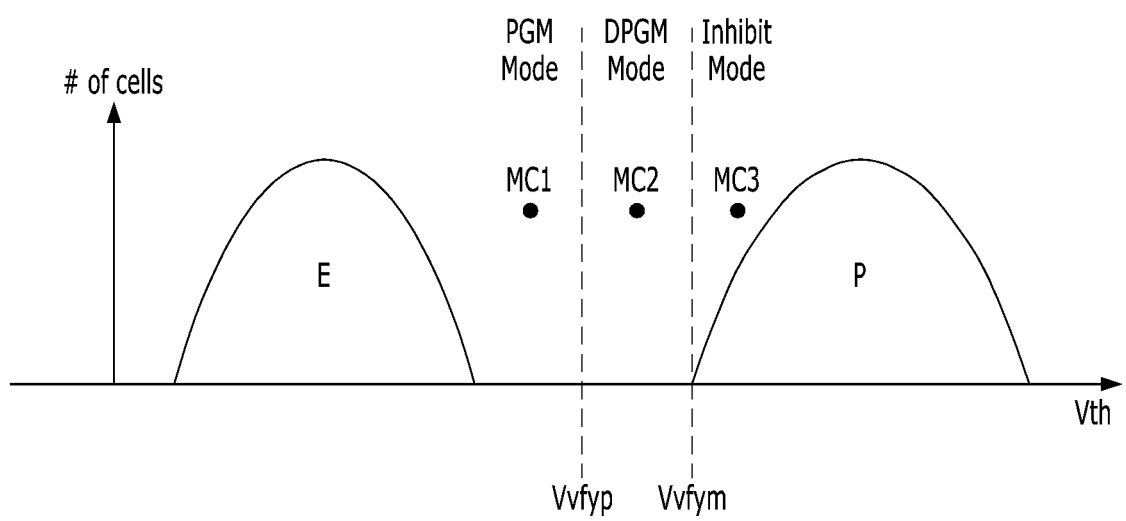
FIG. 6 illustrates an embodiment of a program operation.

FIG. 6 illustrates an embodiment of a program operation in the memory device 150. In FIG. 6, a non-volatile memory cell of the memory device 150 can store single-bit (1-bit) data, and the memory device 150 may be controlled such that a threshold voltage of the non-volatile memory cell becomes in one of an erase state E or a program state P. When the incremental step pulse programming (ISPP) operation is performed as described with reference to FIGS. 4 to 5, the threshold voltage of the non-volatile memory cell may be changed from the erase state E to the program state P. Also, it is noted that, in FIG. 5, the verification operation may be performed after a program pulse is applied.

Referring to FIG. 6, the verification operation may can use two verification voltages Vvfp, Vvfym. For example, a data program operation supporting a double verify program (DPGM) operation may perform a verify operation with two different levels of verification voltage during a verify operation. Through the verification operation using two different verification voltage levels, the degree to which the non-volatile memory cell is programmed in response to a next program pulse may be adjusted. For example, the memory device 150 can determine the amount of change in the threshold voltage that could be caused by a following program pulse.

According to an embodiment, the verification voltage may include a pre-verification voltage Vvfyp and a main verification voltage Vvfym. The main verification voltage Vvfym may be a verification voltage corresponding to a target state of the data program operation. The pre-verification voltage Vvfyp may have a level lower than the main verification voltage Vvfym. In the verification operation, the pre-verification voltage Vvfyp can be used for checking the degree to which the data program operation is performed on a non-volatile memory cell. When it is checked by the verification operation (using the main verification voltage Vvfym) that a threshold voltage of the non-volatile memory cell is changed with the program state P, the non-volatile memory cell does not need to be further programmed by a following program pulse. Also, when the threshold voltage of the non-volatile memory cell is lower than the pre-verification voltage Vvfyp, the non-volatile memory cell may be programmed by the following program pulse.

If the threshold voltage of the non-volatile memory cell is in a range between the pre-verification voltage Vvfyp and the main verification voltage Vvfym, the non-volatile memory cell could be programmed too much (e.g., the threshold voltage of the non-volatile memory cell may shift rightward too much, e.g., in which case overprogramming may occur) when normally programmed by the following program pulse. Thus, the memory device 150 could reduce the amount of change in the threshold voltage. In this case, the memory device 150 may control or adjust the degree to which the non-volatile memory cell is programmed (e.g., the amount of change in the threshold voltage) while the following program pulse is applied.

Also, in FIG. 6, when a plurality of non-volatile memory cells is programmed by a program pulse and then a verification operation is performed using the pre-verification voltage Vvfyp and the main verification voltage Vvfym, the plurality of non-volatile memory cells can be in three different states MC1, MC2, MC3. For a non-volatile memory cell having a first state MC1 lower than the pre-verification voltage Vvfyp, the memory device 150 may apply a next program pulse to induce a change of threshold voltage of the corresponding memory cell by an amount or shift corresponding to the corresponding program pulse. Such a general program mode (PGM Mode) may be referred to as a first program mode.

On the other hand, if a non-volatile memory cell has a third state MC3 higher than the main verification voltage Vvfym, the memory device 150 may avoid or inhibit further programming the corresponding memory cell by the following program pulse because the threshold voltage of the non-volatile memory cell has already reached the program state P. In one embodiment, inhibiting a non-volatile memory cell from being additionally programmed may be referred to as a program inhibit mode.

When the non-volatile memory cell is in a second state MC2, the threshold voltage of the non-volatile memory cell may shift too much when the corresponding non-volatile memory cell is programmed in the first program mode (PGM mode). Thus, in the second program mode (DPGM mode) when the following program pulse is applied, the amount of change of the threshold voltage may be smaller than that caused in the first program mode (PGM mode).

The degree to which the non-volatile memory cell is programmed (e.g., an amount of change in threshold voltage) may be determined based on the time for which the program pulse is applied, the number of times the program pulse is applied, and/or the potential difference between the program pulses. Although a program pulse applied to plural non-volatile memory cells connected to a single word line may be the same in some embodiments, the memory device 150 can change or adjust a threshold voltage change amount of each non-volatile memory cell. To increase threshold voltages of the plural non-volatile memory cells by different amounts, the memory device 150 can change or adjust potentials of bit lines connected to the plural non-volatile memory cells.

For example, during a period in which a program pulse is applied to the word line, a reference (e.g., ground) voltage may be applied to a bit line connected to a first memory cell of which threshold voltage is in the first state MC1, but the potential of another bit line connected to a second memory cell (having a threshold voltage in the second state MC2) could be higher than the reference (e.g., ground) voltage. Because the potential difference between a word line and a bit line connected to a non-volatile memory cell is less, the change amount of the threshold voltage caused by the program pulse may be smaller.

When the potential difference between the word line and the bit line is lower than a preset level, the non-volatile memory cell would be not programmed. Because the potential difference of the second memory cell having the second state MC2 is smaller than that of the first memory cell having the first state MC1, the degree to which the second memory cell is programmed by the following program pulse can be less than that of the first memory cell.

Further, even when the following program pulse is applied to a third memory cell having the third state MC3, a program inhibit voltage can be applied to a bit line coupled to the third memory cell. Because the potential difference between the program pulse and the program inhibit voltage applied to the third memory cell having the third state MC3 is lower than the preset level, the third memory cell having the third state MC3 might be not further programmed by the following program pulse.

The program mode may be determined according to the verification result corresponding to a program operation performed on the non-volatile memory cell. The program mode may include the first program mode (PGM Mode), the second program mode (DPGM Mode), and the third program mode (PGM Inhibit Mode). For example, a verify pass may indicate that a non-volatile memory cell is read as an off cell in response to a verification voltage. A verify fail may indicate that the non-volatile memory cell is read as an on cell in response to the verification voltage. For example, if the threshold voltage of the non-volatile memory cell is lower than the verification voltage (located to the left), the non-volatile memory cell may be read as an on cell. But, if the threshold voltage is equal to, or higher than, the verification voltage (located to the right), the non-volatile memory cell may be read as an off cell.

Referring to FIG. 6, a non-volatile memory cell in which the program mode is the first program mode (PGM Mode) may be read as an on cell by both the pre verify voltage Vvfyp and the main verify voltage Vvfym. Another non-volatile memory cell in which the program mode is the second program mode (DPGM Mode) may be read as an off cell by the pre-verification voltage Vvfyp and read as an on-cell by the main verify voltage Vvfym. Another non-volatile memory cell in which the program mode is the third program mode (PGM Inhibit Mode) may be read as an off cell by both the pre verify voltage Vvfyp and the main verify voltage Vvfym. Meanwhile, because the pre-verification voltage Vvfyp has a smaller level than that of the main verification voltage Vvfym, there may be no case when a non-volatile memory cell is read as an on cell by the pre-verification voltage Vvfyp and read as an off cell by the main verification voltage Vvfym.

Figure 7:
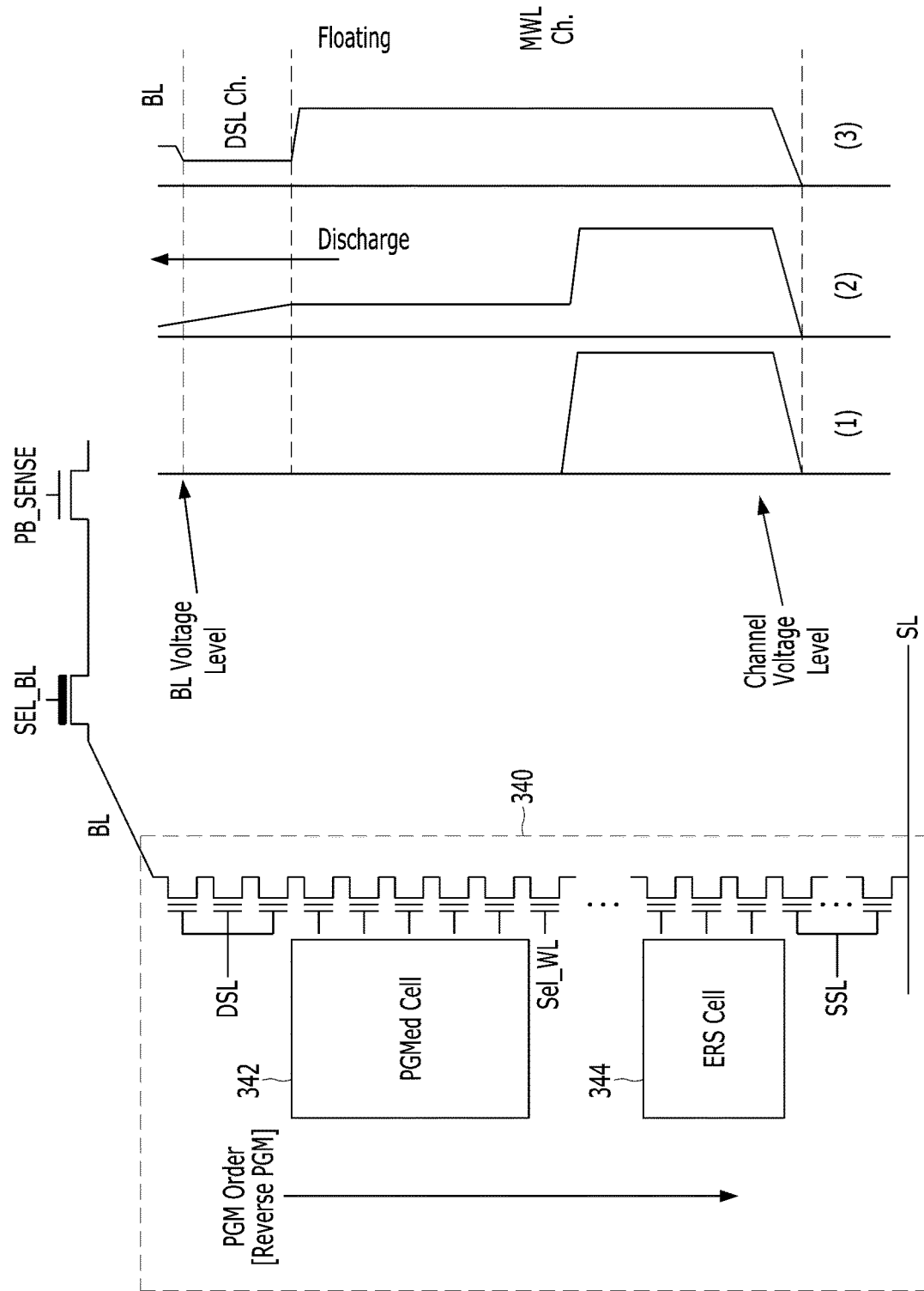
FIG. 7 illustrates an example of the discharge of a string and a bit line during a program operation.

FIG. 7 illustrates an embodiment for discharge of a string and a bit line during a program operation.

Referring to FIG. 7, the memory device 150 can include a string 340 having a plurality of non-volatile memory cells. The string 340 may have a first transistor and a second transistor. The first transistor may be connected to a bit line BL and operate in response to a first control voltage applied through the drain select line DSL. The second transistor may be connected to a source line SL and operate in response to a second control voltage applied through a string select line SSL, and at least one non-volatile memory cell connected between the first and second transistors. The at least one non-volatile memory cell can be programmed by a program pulse applied through a word line. The source line SL shown in FIG. 7 may correspond to the common source line CSL described with reference to FIG. 1, the first transistor may correspond to the drain select transistor DST, and the second transistor may correspond to the string select transistor SST. According to an embodiment, the first transistor and/or the second transistor may be individually implemented as a plurality of transistors connected in series with each other.

As the storage space of the memory device 150 increases, the number of non-volatile memory cells serially connected between the first transistor and the second transistor may increase. Referring to FIG. 7, multi-bit data can be sequentially programmed in a preset order (PGM Order) from a non-volatile memory cell connected to the first transistor to another non-volatile memory cell connected to the second transistor.

The plurality of non-volatile memory cells in the string 340 can be divided into a programmed non-volatile memory cell (PGMed Cell) 342 having a programmed state (e.g., P in FIG. 6) and an erased non-volatile memory cell (ERS Cell) 344 in which data is erased to maintain an erased state (e.g., E in FIG. 6). When a next program operation is performed, a program pulse may be applied to a selected word line Sel_WL connected to the non-volatile memory cell located next to the programmed nonvolatile memory cell 342.

A program pulse may be applied to the selected word line Sel_WL to selectively program data in non-volatile memory cells connected to the selected word line Sel_WL. After a program pulse is applied, charges remaining in the string 340 may be removed for performing a verification operation corresponding to the program pulse or a next program operation corresponding to a following program pulse. In order to discharge the charges remaining in the bit line BL connected to the string 340, the first transistor may be turned on by the first control voltage applied through the drain select line DSL. When a program pulse is applied to the selected word line Sel_WL, a pass voltage Vpass may be applied to a word line connected to the programmed non-volatile memory cell 342 to reduce resistance. When the resistance of channel (DSL Ch., MWL Ch.) is reduced, discharge may occur quickly in the channel (DSL Ch., MWL Ch.) of the string 340.

While the program operations are repeatedly performed, a threshold voltage of the first transistor (operated by the first control voltage applied through the drain select line DSL) may continue to increase. In this case, the first control voltage applied through the drain select line DSL may be changed to be higher than a preset voltage, in order to turn on the first transistor but reduce a resistance of the first transistor so that charges could be discharged more quickly. When the first control voltage applied through the drain select line DSL for discharge is over-voltage driving (OVD), the memory device 150 can perform the first, second, or third program mode corresponding to the program pulse described in FIG. 6 faster than that when the first control voltage is not overdriving. Through this procedure, a program operation speed of the memory device 150 may be improved.

In FIG. 7, in response to operation of the first transistor by the first control voltage applied through the drain select line DSL during the data program operation, there are three cases: a first state (1) in which charges are accumulated in a channel of the string 340; a second state (2) in which undischarged charges remain in the channel of the string 340; and a third state (3) in which charges could be not discharged when the channel of the string 340 is floating. How these three states can occur during the data program operation will be described in more detail with reference to FIG. 8.

Figure 8:
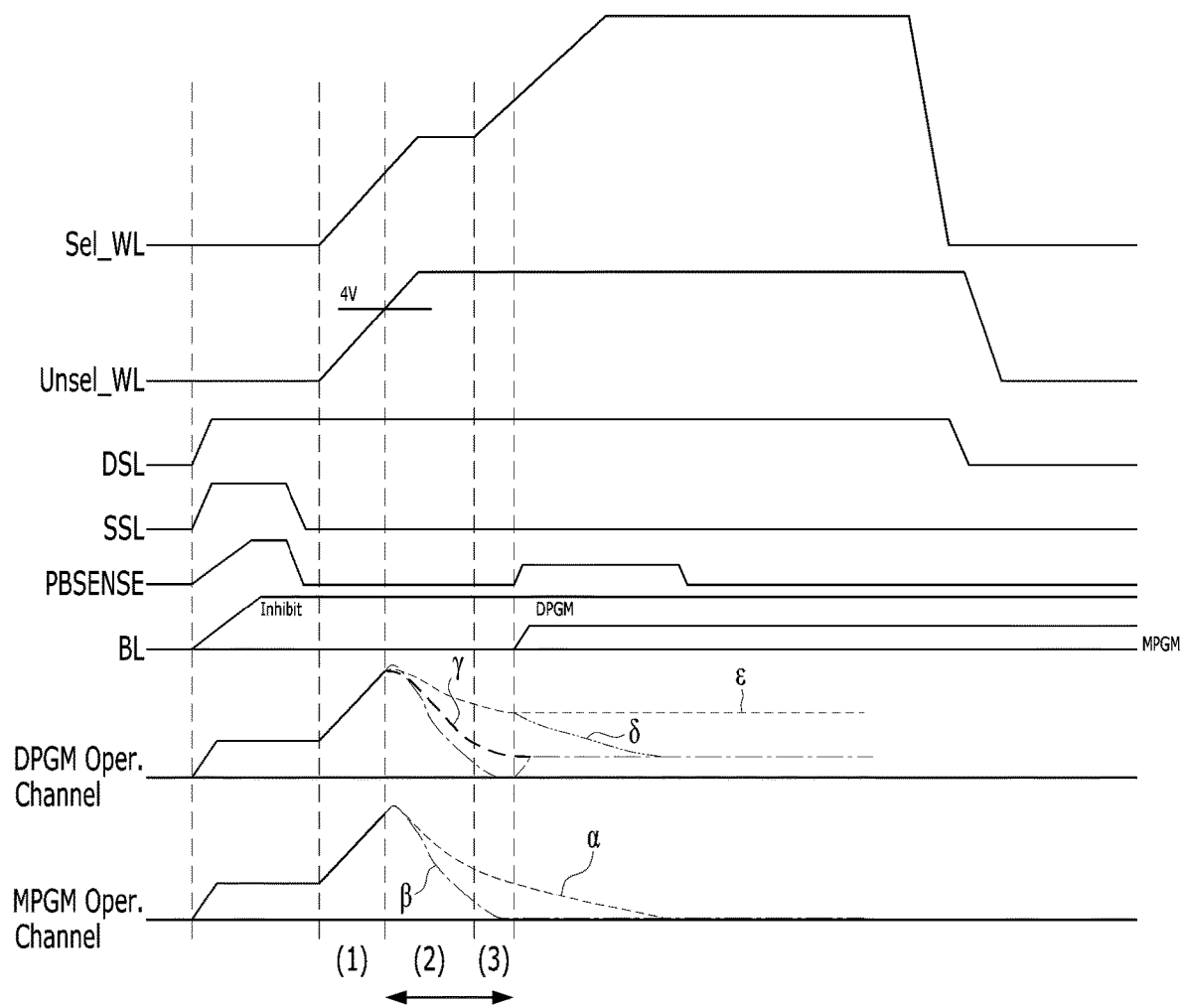
FIG. 8 illustrates an example of a program operation that may vary according to discharge of a string and a bit line.

FIG. 8 illustrates an embodiment of a program operation that may vary according to discharge of a string and a bit line. For example, FIG. 8 illustrates discharge of the channel of the string 340 through a first transistor operated by a first control voltage applied through a drain select line DSL before or while a program pulse is applied during a data program operation.

Referring to FIG. 8, when a program pulse is applied to the selected word line Sel_WL, a pass voltage may be applied to the unselected word line Unsel_WL. Before the program pulse is applied, the first control voltage and the second control voltage may be applied to the drain select line DSL and the string select line SSL, individually. Thereafter, when a page buffer control signal PBSENSE is activated, the potential of each bit line BL may be maintained differently.

As described with reference to FIG. 6, the page buffer control signal PBSENSE may be activated in response to one of three program modes. For example, when a program mode regarding a non-volatile memory cell is the first program mode (PGM mode, general PGM mode, MPGM), a bit line connected the non-volatile memory cell is maintained at the reference (e.g., ground) voltage. When the program mode is the third mode (PGM Inhibit mode), the potential of the bit line can be increased by a program inhibit voltage. When the program mode of the non-volatile memory cell is the second mode (DPGM), the potential of the bit line may be increased with a time difference. In order to reduce the degree to which data is programmed in the nonvolatile memory cell, the potential of the bit line is changed while the program pulse is applied. After the program pulse is applied, the second control voltage applied through the string selection line SSL may be deactivated.

While a data program operation is performed on a plurality of non-volatile memory cells 342 included in the string 340, the threshold voltage of the first transistor (operated by the first control voltage applied through the drain select line DSL) may increase. When the level of the pass voltage applied to the unselected word line Unsel_WL exceeds a specific potential (e.g., 4V) after the program pulse is applied, charges remaining in the channel in the string 340 may be discharged.

Because discharge does not occur before the level of the pass voltage exceeds the specific potential, the potential of the channel (DPGM Oper. Channel, MPGM Oper. Channel) in the string 340 may continue to increase. In order to clearly distinguish programming degrees of the first program mode and the second program mode from each other (e.g., change amounts in threshold voltage through the first program mode and the second program mode), discharging the potential of the channel (DPGM Oper. Channel, MPGM Oper. Channel) in the string 340 might be performed. However, because discharge does not occur before the potential of the pass voltage exceeds the specific potential. Further, when the threshold voltage of the first transistor increases, it could be difficult to discharge the potential of the channel (DPGM Oper. Channel, MPGM Oper. Channel) in the string 340 so that a time for discharging the potential may not be sufficient.

Various cases ($\alpha$, $\beta$, $\gamma$, $\delta$, $\varepsilon$) according to a discharge rate of the channel potentials (DPGM Oper. Channel, MPGM Oper. Channel) in the string 340 will be described as examples. In a first case ($\alpha$), a potential of the channel (MPGM Oper. Channel) in the string 340 including a non-volatile memory cell is slowly discharged when the corresponding non-volatile memory cell is programmed in the first program mode. But, in a second case ($\beta$), the potential of the channel (MPGM Oper. Channel) in the string 340 including a non-volatile memory cell is rapidly discharged when the corresponding non-volatile memory cell is programmed in the first program mode.

In addition, when a non-volatile memory cell is programmed in the second program mode, the potential of the channel (DPGM Oper. Channel) in the string 340 including the non-volatile memory cell is rapidly discharged in a third case ($\gamma$) or slowly discharged in fourth and fifth cases ($\delta$, $\varepsilon$). Although it may be desirable to discharge the channel potential (DPGM Oper. Channel, MPGM Oper. Channel) so that a potential of the channel corresponds to the ground voltage, a program operation with the second program mode can be successfully performed when the potential of the channel is lower than a potential of the bit line BL, which is raised by the page buffer control signal PBSENSE.

For example, it might be difficult to adjust or change a potential of the bit line BL to control the degree to which the non-volatile memory cell is programmed (e.g., an amount of change in threshold voltage) in the following cases: in the first case ($\alpha$) when the channel potential (MPGM Oper. Channel) of the string 340 is slowly discharged while a program operation is performed with the first program mode, in the fourth case ($\delta$) when the channel potential (DPGM Oper. Channel) of the string 340 is slowly discharged while a program operation is performed with the second program mode, or in a fifth case ($\varepsilon$) when the channel (DPGM Oper. Channel) of the string 340 is floated by a threshold voltage of the transistor connected to the drain select line DSL.

When the potential of the bit line BL would not be sufficiently discharged, the degree to which the non-volatile memory cell is programmed is lower than a preset level or a preset amount. Even though the non-volatile memory cell is scheduled to be programmed with the first program mode or the second program mode, the non-volatile memory cell might be programmed with the third program mode (e.g., PGM Inhibit mode). In this case, because the non-volatile memory cell is not sufficiently programmed, the memory device 150 can determine that the corresponding non-volatile memory cell is a bad memory cell even though the corresponding non-volatile memory cell is a good (e.g., healthy or properly functioning) memory cell.

According to an embodiment, when the memory device 150 overdrives the level of the first control voltage applied through the drain select line DSL, a discharge issue can be resolved. Even though the threshold voltage of the first transistor (operated by the first control voltage applied through the drain select line DSL) can unintentionally increase during a program operation performed to the plurality of non-volatile memory cells 342, overdriving of the first control voltage could avoid a slow discharge. For example, when the potential difference between the first control voltage and the increased threshold voltage of the first transistor is lower than a potential of the bit line BL, the potential of the bit line BL could be increased by the second program mode from a state in which the channel is not completely discharged. In this case, the second program mode might not be successfully performed because the channel is in a floating state, for example, as described with reference to FIG. 7.

As the storage space of the memory device 150 increases, the number of serially connected non-volatile memory cells included in the string 340 may increase. As the number of non-volatile memory cells becomes greater, the number of program operations performed in the string 340 can be greater. Accordingly, it might be plausible that the threshold voltage of the first transistor included in the string 340 may increase according to the number of program operations. To improve a program operation, the memory device 150 according to an embodiment can control or change the level of the first control voltage applied through the drain select line DSL in response to the number of times the program pulse is applied from the string 340.

Figure 9:
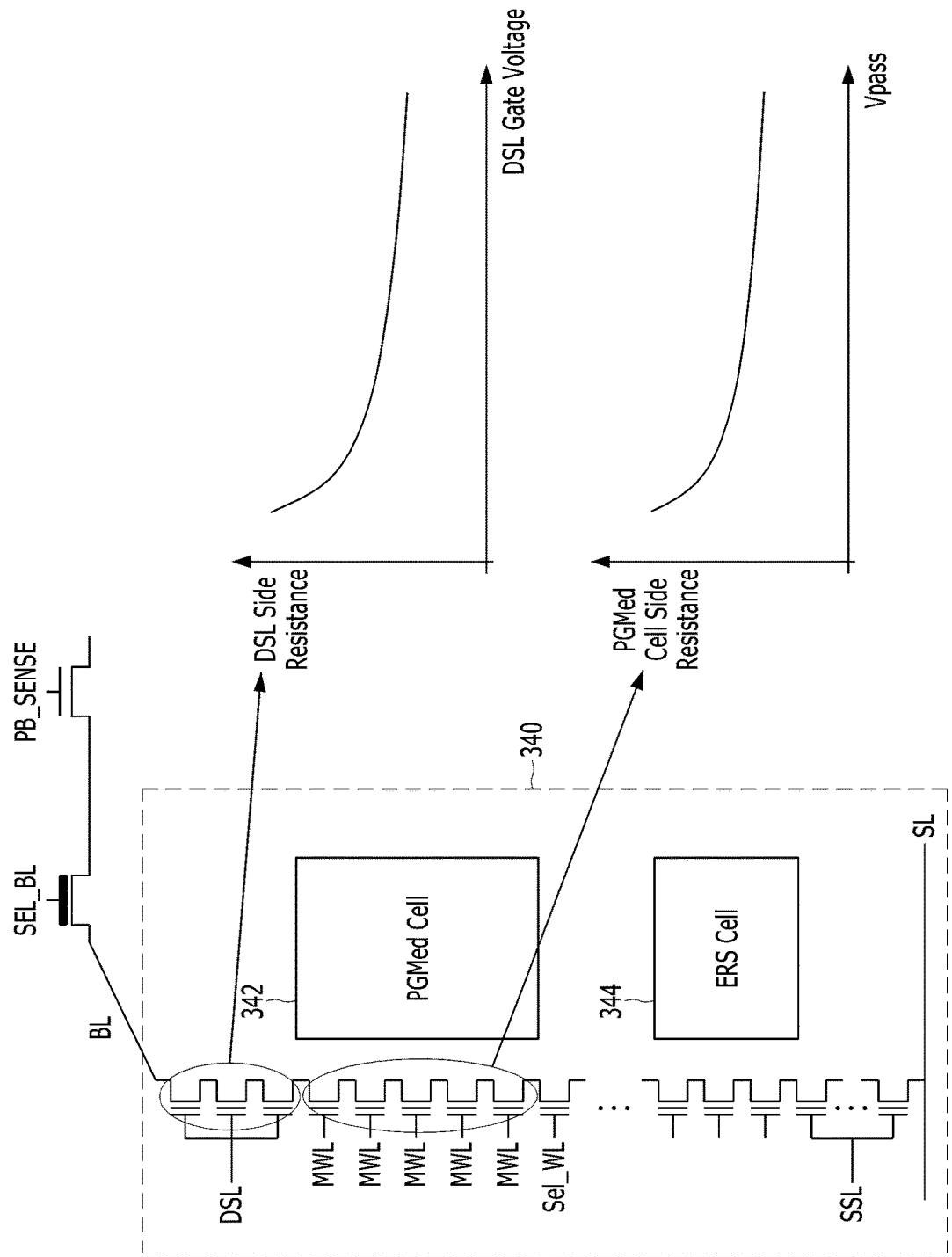
FIG. 9 illustrates an embodiment of a method for controlling the discharge of strings and bit lines.

FIG. 9 illustrates an embodiment of a method for controlling discharge of strings and bit lines. Specifically, FIG. 9 describes a resistance change of the programmed non-volatile memory cell 342 in the string as well as a resistance change of the first transistor, for a data program operation of the non-volatile memory cell connected to the selected word line Sel_WL.

The resistance change of the programmed non-volatile memory cell 342 can be varied based on a level of a pass voltage Vpass applied to multiple word lines MWL connected to the programmed non-volatile memory cell 342. The resistance change of the first transistor can be varied according to a level of the first control voltage applied through the drain select line DSL.

Referring to FIG. 9, as the level of the pass voltage increases, the resistance of the programmed non-volatile memory cell 342 could be decreased. Also, as the level of the first control voltage applied through the drain select line DSL increases, the resistance of the first transistor may be decreased. Accordingly, when the level of the first control voltage applied through the drain select line DSL is increased, charges of the channel in the string 340 can be discharged sufficiently during a preset operation margin. Thus, the preset operation margin for discharge could be reduced so that a program operation can be performed at a faster rate.

Figure 10:
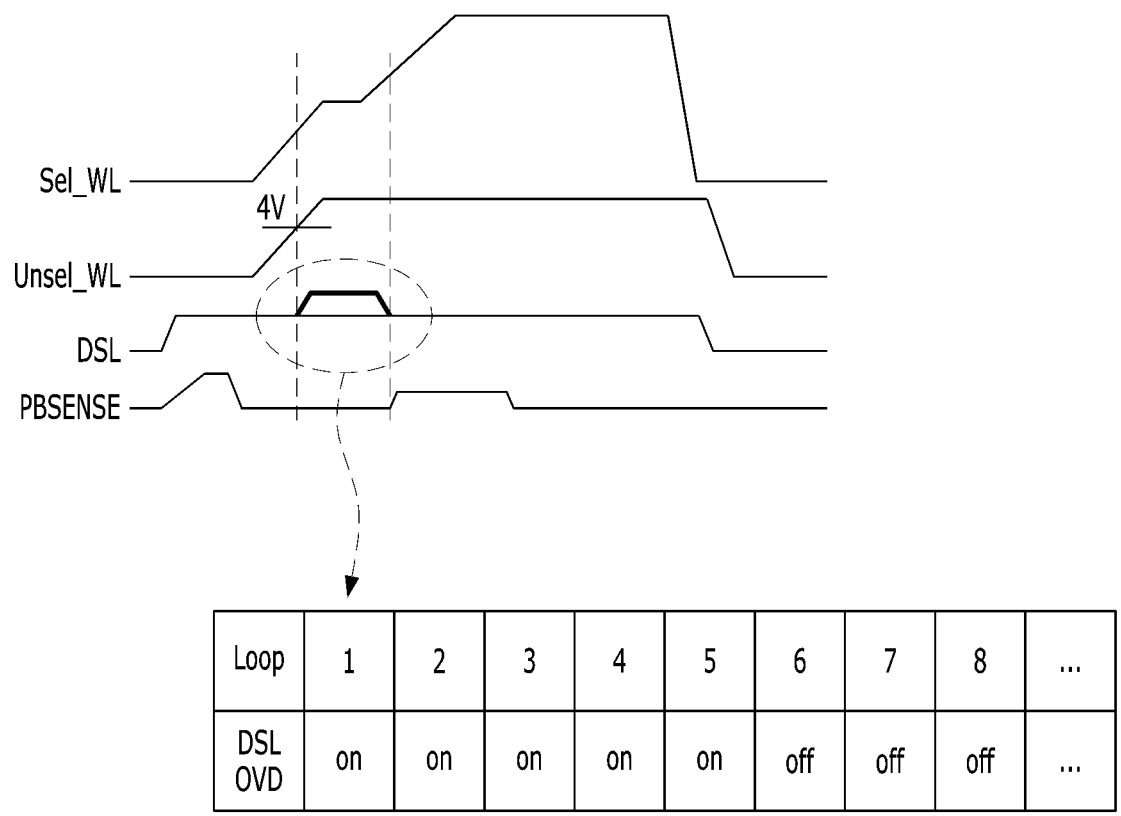
FIG. 10 illustrates an embodiment of a control method for a drain select line (DSL).

FIG. 10 illustrates an embodiment of a first control method regarding a drain select line (DSL).

Referring to FIG. 10, in order to discharge the charge of the channel of the string 340, the memory device 150 can control the level of the first control voltage applied through the drain select line DSL to be higher than a preset level after a pass voltage Vpass (applied to an unselected word line Unsel_WL) exceeds a preset level (e.g., 4V), until a page buffer control signal PBSENSE is activated to perform the second program mode.

In this case, when the threshold voltage of the first transistor operated by the first control voltage applied through the drain select line DSL does not increase, it might not be necessary to increase or overdrive the first control voltage having a level higher than the preset level. Accordingly, in response to the number of program operations performed in the string 340, the memory device 150 may selectively increase or overdrive the first control voltage applied through the drain select line DSL to be higher than the preset level. For example, when program pulses are repeatedly applied through the ISPP operation, and/or when the program pulse is applied more than a preset number of times (e.g., the last one to five loops of program pulses in the ISPP operation), the first control voltage applied through the drain selection line DSL 1 can be overdriven to be maintained higher than the preset level (i.e., DSL OVD "on").

According to an embodiment, whether to overdrive the first control voltage applied through the drain select line DSL higher than the preset level can be determined based on which word line the program operation is performed from the first transistor in the string 340. For example, as a non-volatile memory cell subject to the program operation is closer to the source line SL, the first control voltage applied through the drain select line DSL may be overdriven to be maintained higher than the preset level.

Figure 11:
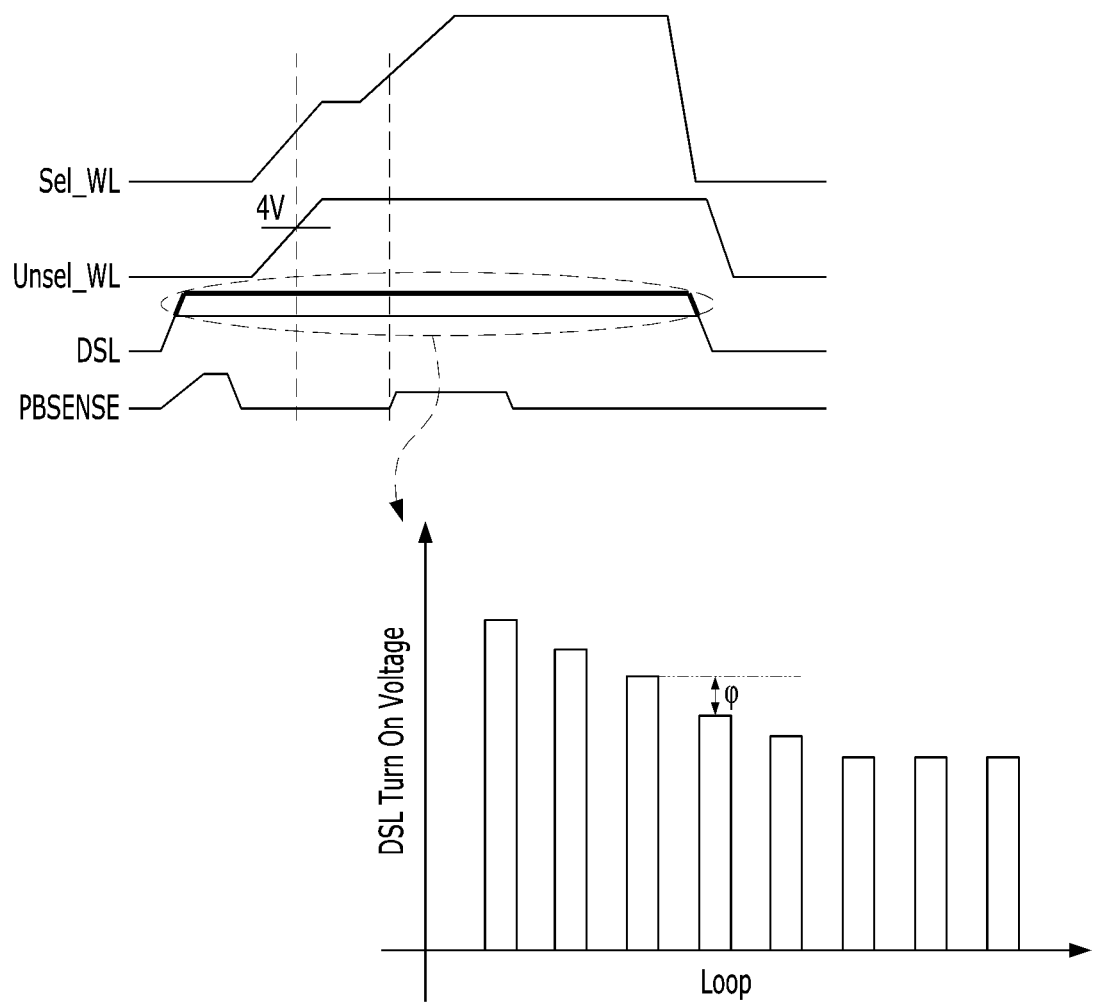
FIG. 11 illustrates an embodiment of a control method for a drain select line (DSL).

FIG. 11 illustrates an embodiment of a second control method regarding a drain select line (DSL).

Referring to FIG. 11, to discharge charges of the channel in the string 340, the memory device 150 can control or maintain the level of the first control voltage applied through the drain select line DSL to be higher than a preset level, after activating a page buffer control signal PBSENSE until the program pulse or pass voltage is not applied.

The discharge rate can depend on a resistance of the string 340. The resistance of the string 340 may be changed based on a threshold voltage of the non-volatile memory cell or the first transistor as well as a temperature inside the memory device 150. For example, as the temperature inside the memory device 150 increases, the resistance of the string 340 can decrease. But, as the temperature decreases, the resistance can increase.

Further, as a greater number of program pulses are applied during a data program operation, the temperature of the string 340 in the memory device 150 can increase. Accordingly, the memory device 150 can determine an initial level of the first control voltage applied through the drain selection line DSL in response to the temperature when a first program pulse is applied during the ISPP operation. Then, the memory device 150 can gradually decrease the level of the first control voltage applied through the drain select line DSL, because the temperature of the string can increase according to the number of times the program pulses are applied.

However, the level of the first control voltage applied through the drain select line DSL could be maintained greater than or equal to a minimum level capable of turning on the first transistor. The degree ($\varphi$) to which the level of the first control voltage applied through the drain select line DSL (i.e., DSL Turn On Voltage) is lowered may be established based on an operating characteristic of the memory device 150.

According to an embodiment, the memory device 150 can store a table regarding the degree ($\varphi$) of how much lowering a level of the first control voltage from the initial level of the first control voltage applied through the drain selection line DSL according to the temperature inside the memory device 150 and/or the number of times of the program pulse application.

FIG. 12 illustrates an example of a table for controlling a drain select line (DSL). Some of numerical values shown in FIG. 12 may show a ratio rather than an absolute value. An embodiment of the present disclosure might not be limited by the numerical values shown in FIG. 12 because those values can be changed depending on characteristics of the memory device 150.

According to an embodiment, the control circuitry 180 or the voltage supply circuit 170 described with reference to FIG. 1 can determine a level of the first control voltage applied through the drain select line DSL based on the table described with reference to FIG. 12.

Referring to FIG. 12, a first table [A] may set an initial level of the first control voltage applied to the drain select line DSL (i.e., DSL Initial Setup) according to an operating environment (e.g., an internal temperature) of the memory device 150. For example, the initial level of the first control voltage applied to the string 340 through the drain select line DSL is 1 which is set regardless of the temperature. The level of the first control voltage can be increased by 2.25 times at 40 degrees Celsius below zero. At 40 degrees Celsius above zero, the level of the first control voltage may be increased by 2.15 times.

A second table [B] may set how much higher than a preset level to drive the first control voltage applied through the drain select line DSL (i.e., DSL OVD Level). For example, a driven level of the first control voltage applied to the string 340 through the drain select line DSL is 1, which is set regardless of the temperature (e.g., the driven level of the first control voltage is equal to the preset level). The first control voltage can be driven to be increased by 2.35 times of the preset level at 40 degrees Celsius below zero. At 40 degrees Celsius above zero, the first control voltage can be driven to be increased by 2.25 times of the preset level.

Through the first table [A] and the second table [B] shown in FIG. 12, the memory device 150 can adjust or change the level of the first control voltage applied through the drain select line DSL according to the operating environment (e.g., the temperature inside the memory device 150).

Figure 13:
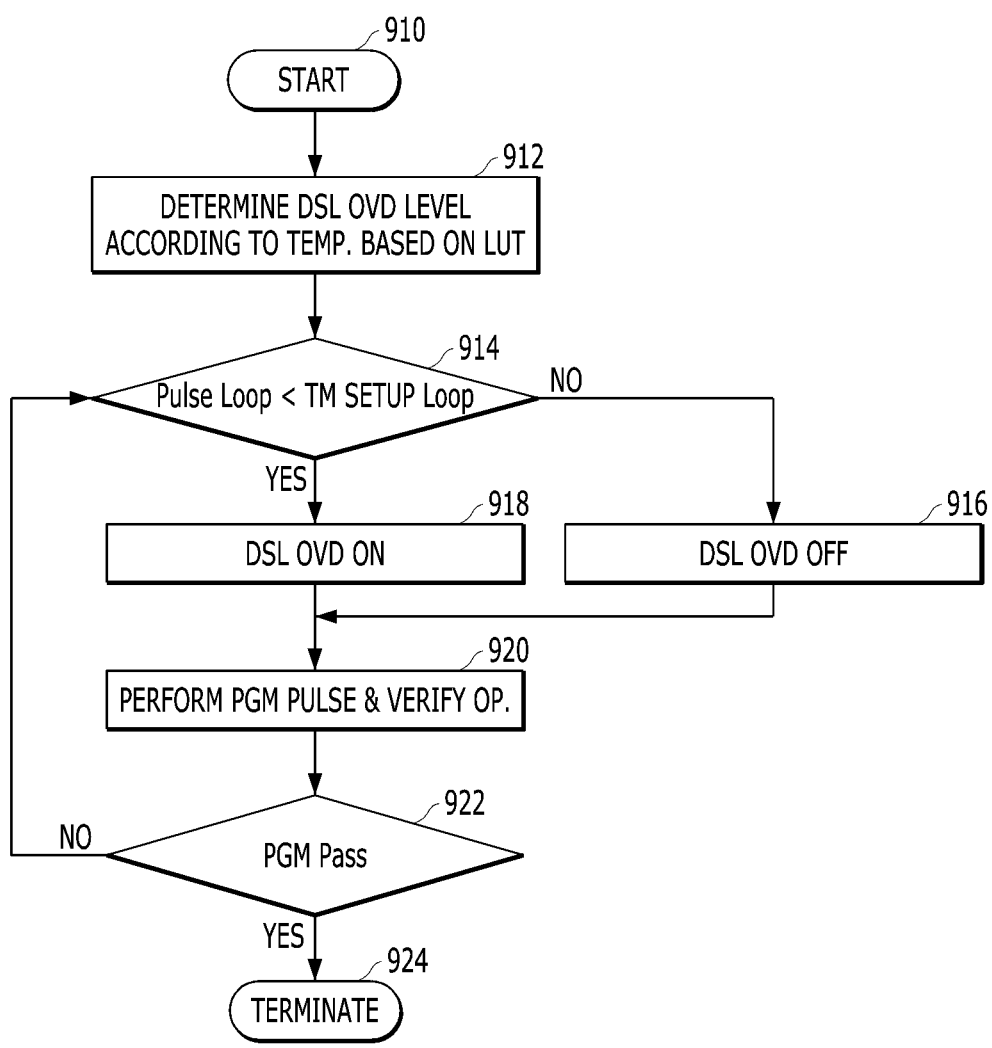
FIG. 13 illustrates an embodiment of a program operation.

FIG. 13 illustrates an embodiment of a first program operation of the memory device 150. The first program operation can include receiving a program command and program data from the controller 130 to start a program operation (operation 910) and determining that the program data is completely programmed into the non-volatile memory cell (YES, of operation 922) to terminate the program operation (operation 924).

When the program operation is started, the memory device 150 can determine how much an initial level of the first control voltage applied through the drain selection line DSL is higher than a preset level (i.e., DSL OVD LEVEL) in response to an operating environment (e.g., a temperature inside the memory device 150) (i.e., TEMP) or whether to change or adjust a level of the first control voltage (i.e., the table of FIG. 12 or a look up table (LUT)) (operation 912). For example, the memory device 150 can determine a level of the first control voltage based on the first and second tables [A], [B] described with reference to FIG. 12. For example, the memory device 150 can change or adjust the level of the first control voltage, e.g., how much higher the level of the first control voltage is changed from an initial value and/or a preset level.

The memory device 150 can perform an ISPP operation for a data program operation. A plurality of program pulses may be applied to program a data item into the non-volatile memory cells. Operations of applying a program pulse and performing a verification operation corresponding the applied program pulse can be considered as a loop or a cycle of the ISPP operation. The memory device 150 may compare a current loop (Pulse Loop) regarding how many times a program pulse is applied to the non-volatile memory cells with a predetermined loop value (TM setting or setup Loop) set to change or adjust the level the first control voltage applied through the drain select line DSL (operation 914). If the current loop (Pulse Loop) is equal to or smaller than the predetermined loop value (TM setting Loop) (No, of operation 914), the memory device 150 may not perform overdriving to increase the first control voltage having a level higher than a preset level (i.e., DSL OVD OFF) (operation 916). Conversely, if the current loop (Pulse Loop) is greater than the predetermined loop value (TM setting Loop) (Yes, of operation 914), the memory device 150 may perform overdriving (OVD) to increase the first control voltage having a level higher than the preset level (i.e., DSL OVD ON) (operation 918). For example, when the number of program pulse applications is greater than a preset value, the first control voltage could be overdriven. But, when the number of program pulse applications is equal to, or smaller than, the preset value, the first control voltage might not be overdriven.

When the first control voltage applied through the drain select line DSL is determined (operations 918, 916), the memory device 150 may perform a program operation of applying a program pulse (i.e., PGM PULSE) and a verification operation (i.e., VERIFY OP.) corresponding to the program pulse (operation 920). According to an embodiment, the memory device 150 can perform the program operation and the verification operation according to the program pulse based on the ISPP operation and/or one of program modes described with reference to FIGS. 3 to 6.

After performing the program operation corresponding to the program pulse, the memory device 150 can determine that data is programmed in the non-volatile memory cell according to a result of the verification operation performed (YES, of operation 922), and then the memory device 150 may terminate the program operation (operation 924). If it is determined that data is not programmed in the non-volatile memory cell according to the result of the verification operation corresponding to the program pulse (No, of operation 922), the memory device 150 can performs a next program operation. Before performing the next program operation, the memory device 150 can compare the current loop (Pulse Loop) with the predetermined loop value (TM setting Loop) which is set to change or adjust the first control voltage applied through the drain selection line (DSL) (operation 914).

Figure 14:
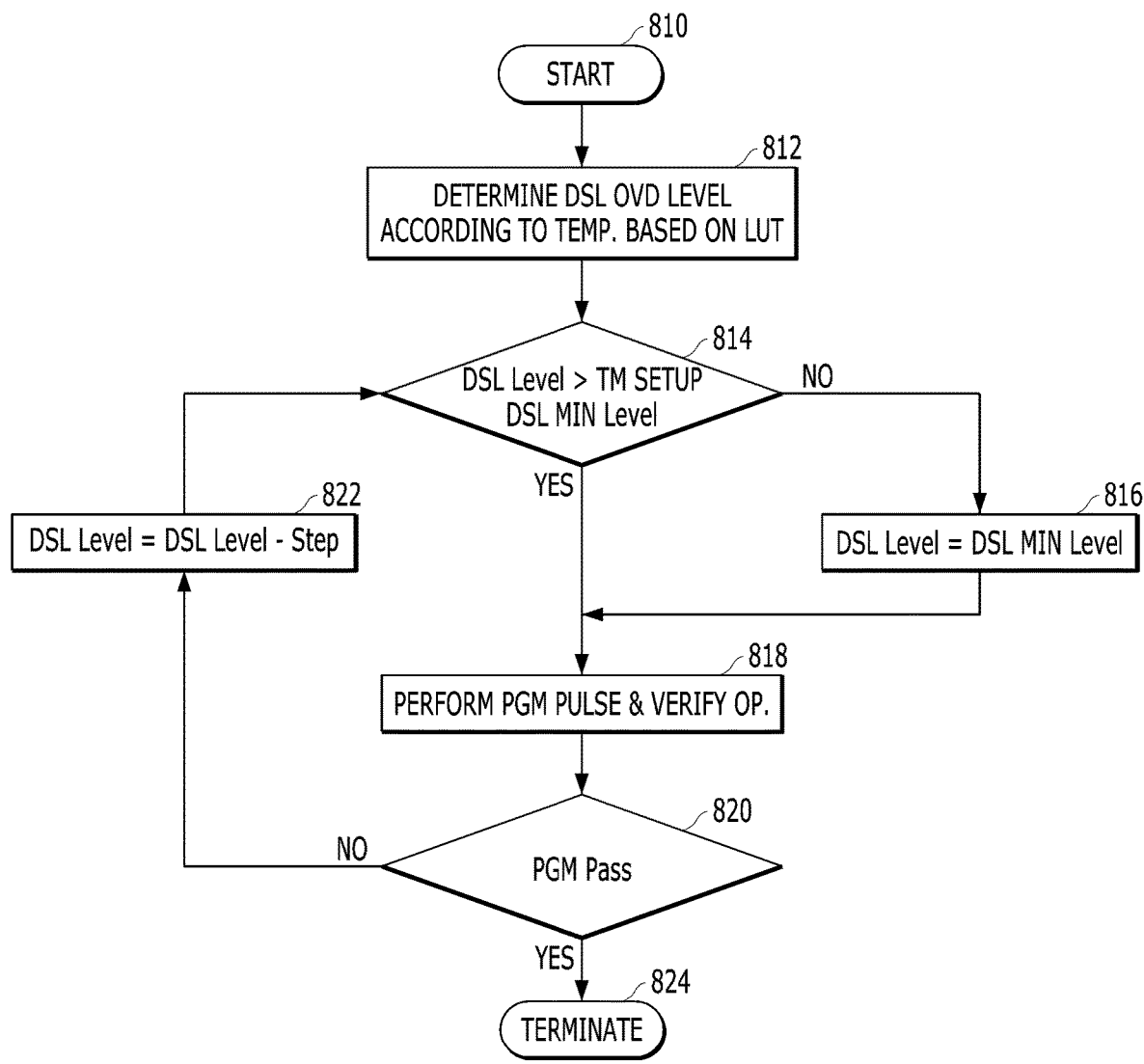
FIG. 14 illustrates an embodiment of a program operation.

FIG. 14 illustrates an embodiment of a second program operation. The second program operation can be started when the memory device 150 receives a program command and program data from the controller 130 (operation 810). If the program data is programmed into the non-volatile memory cell (i.e., PGM Pass) (YES, of operation 820), the second program operation can be terminated (operation 824).

When the program operation is started, the memory device 150 may determine an initial value of the first control voltage which is applied through the drain select line DSL in response to an operating environment, e.g., a temperature (TEMP) (operation 812). For example, the memory device 150 may determine the initial value of the first control voltage with reference to the first table [A] described with reference to FIG. 12 (e.g., a look up table (LUT)).

The memory device 150 may compare the current level (DSL Level) of the first control voltage applied through the drain selection line (DSL) with a minimum value (TM setting or setup DSL MIN Level) set for the first control voltage (operation 814). According to an embodiment, the memory device 150 can calculate a minimum level (TM setting DSL MIN Level) for the first control voltage applied through the drain selection line DSL in response to an operating environment (e.g., an internal temperature) and/or the number of times a program pulse is applied. The memory device 150 can include a table for storing a preset minimum value.

If the current level (DSL Level) of the first control voltage is equal to or smaller than the minimum value (TM setting DSL MIN Level) set for the first control voltage (No, of operation 814), the memory device 150 can adjust or change a current level of the first control voltage (DSL Level) based on an operating environment (e.g., an internal temperature) and a minimum value corresponding to the number of times the program pulse is applied (operation 816). If the current level (DSL Level) of the first control voltage is greater than the minimum value (TM setting DSL MIN Level) set for the first control voltage (Yes, of operation 814), the current level (DSL Level) of the first control voltage can be used as is (e.g., not changed or adjusted).

When the level of the first control voltage applied through the drain select line DSL is determined (operations 814, 816), the memory device 150 may perform a program operation (PERFORM PGM PULSE) and a verify operation (VERIFY OP.) corresponding to the program pulse (operation 818). According to an embodiment, the program operation and the verification operation according to the program pulse may be performed based on the ISPP operation and the plurality of program modes described with reference to FIGS. 3 to 6.

After performing the program operation corresponding to the program pulse, the memory device 150 can determine that data is programmed in the non-volatile memory cell according to a result of the verification operation (YES, of operation 922), so that the memory device 150 may terminate the program operation (operation 924). When the memory device 150 can determine that data has not been programmed into the non-volatile memory cell according to the result of the verification operation corresponding to the program pulse (No, of operation 922), the level of the first control voltage applied the drain select line DSL can be adjusted to a preset level (e.g., a changed level ($\varphi$) of the first control voltage described with reference to FIG. 11) (i.e., DSL Level=DSL Level−Setup) (operation 822).

After changing a level of the first control voltage applied through the drain select line DSL (operation 822), the memory device 150 can perform an operation 814 of comparing the current level (DSL Level) of the first control voltage applied through the drain select line DSL with the minimum value (TM setting DSL MIN Level) set for the first control voltage.

Referring to FIGS. 13 and 14, before applying a program pulse to program data into the non-volatile memory cell during the first program operation and the second program operation, the memory device 150 can determine the level of the first control voltage applied to the drain select line DSL. Thereafter, at the operation timings described with reference to FIGS. 10 and 11 during the program operation, the first control voltage applied through the drain select line DSL can be determined to have a specific level. When the first control voltage is applied, charges in the channel of the string 340 can be discharged.

In accordance with one or more of the aforementioned embodiments, a semiconductor device can program non-volatile memory cells with data in different modes in response to a program-verification result during an incremental step pulse programming (ISPP) operation. During the ISPP operation, the semiconductor device can adjust or change the level of control voltage applied through a bit line selection line or a drain select line (DSL) so that a program operation speed could be improved.

Further, one or more embodiments include a semiconductor device that can divide non-volatile memory cells into three groups subjected to a normal program operation (MPGM), a double verify program (DPGM), and a program inhibit (PGM Inhibit) in response to a program-verification result during an incremental step pulse programming (ISPP) operation. After determining a program pulse applied based on a programmed state, the semiconductor device can change or adjust a control voltage level applied to a bit line select line or a drain select line (DSL) according to the program pulse and an operating environment, thereby reducing a time spent on discharging a bit line or a channel.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, generators and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, control circuitry, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory device, comprising:
    a memory structure including at least one non-volatile memory cell configured to store multi-bit data; and
    a controller configured to:
    perform a program verification after a first program pulse is applied to the at least one non-volatile memory cell during a data program operation, the data program operation including applying a plurality of program pulses to program multi-bit data to the at least one non-volatile memory cell and the first program pulse being one of the plurality of program pulses,
    determine a program mode for the at least one non-volatile memory cell based on a result of the program verification, and
    change at least one of a level of a first control voltage based on the program mode, the first control voltage applied to a drain select line (DSL) coupled to the at least one non-volatile memory cell,
    wherein the program mode corresponding to a second program pulse applied after the first program pulse is determined as one selected from a first mode, a second mode, and a third mode, the first mode to apply the second program pulse to change or adjust a threshold voltage of the at least one non-volatile memory cell by a first level which is equal to, or larger than, that caused by the first program pulse; the second mode to apply the second program pulse to change or adjust the threshold voltage of the at least one non-volatile memory cell by a second level which is smaller than that caused by the first program pulse; and the third mode to apply the second program pulse to the at least one non-volatile memory cell of which a change of the threshold voltage is inhibited.

2. The memory device according to claim 1, wherein the memory structure comprises:
    a first transistor coupled between the at least one memory cell and the bit line, the first transistor configured to operate in response to the first control voltage applied to the drain select line (DSL); and
    a second transistor coupled between the at least one memory cell and a source line, the second transistor configured to operate in response to a first control voltage applied to a string select line (SSL),
    wherein the at least one memory cell is coupled between the first transistor and the second transistor and is configured to store the multi-bit data through the plurality of program pulses.

3. The memory device according to claim 2, wherein:
    the at least one memory cell comprises N number of transistors serially connected to each other between the first transistor and the second transistor, and the controller programs the multi-bit data to the at least one memory cell in an order of a transistor connected to the first transistor to another transistor connected to the second transistor, among the N number of transistors.

4. The memory device according to claim 1, wherein the controller is configured to:
    determine the level of the first control voltage in response to a temperature of the memory device, and
    determine whether the level of the first control voltage is changed or adjusted in response to a number of program pulses applied to the at least one non-volatile memory cell during the data program operation.

5. The memory device according to claim 4, wherein the controller applies a program pulse and performs the program verification corresponding to the program pulse after determining the level of the first control voltage.

6. The memory device according to claim 4, wherein the controller is configured to:
    compare the number of program pulses applied to the at least one non-volatile memory cell during the data program operation with a predetermined number to change or adjust the level of the first control voltage, and
    determine whether an over-voltage driving is applied in response to a comparison result.

7. The memory device according to claim 4, wherein the controller decreases the level of the first control voltage by a predetermined level corresponding to the number of programming pulses applied to the at least one non-volatile memory cell during the data program operation.

8. The memory device according to claim 7, wherein the controller avoids that the level of the first control voltage is lower than a minimum level for operating a transistor connected to the drain select line (DSL).

9. The memory device according to claim 1, wherein the control device changes the level of the first control voltage when the program mode is the second mode.

10. The memory device according to claim 1, wherein the controller increases a level of a pass voltage applied to the memory structure, the level of the first control voltage applied to the drain select line (DSL), or a level of a second control voltage applied to a string select line (SSL).

11. A memory system, comprising:
    a memory device comprising plural non-volatile memory cells; and a controller configured to receive a write command and write data from a host, determine a location in which the write data is stored in the memory device, and transfer the write data to the memory device,
    wherein:
    during a data program operation which includes applying a plurality of program pulses to program the write data to the plural non-volatile memory cells, the memory device is configured to:
    determine a program mode causing a change of threshold voltages of the plural non-volatile memory cells, and
    change at least one of a level of a first control voltage based on the program mode, the first control voltage to be applied to a drain select line (DSL) coupled to the plural non-volatile memory cells,
    wherein the memory device is configured to:
    determine the level of the first control voltage in response to a temperature of the memory device, and
    determine whether the level of the first control voltage is changed or adjusted in response to a number of program pulses applied to the at least one non-volatile memory cell during the data program operation.

12. The memory system according to claim 11, wherein the memory device is configured to:
compare the number of program pulses applied to the at least one non-volatile memory cell during the data program operation with a predetermined number to change or adjust the level of the first control voltage, and
determine whether an over-voltage driving is applied in response to a comparison result.

13. The memory system according to claim 11, wherein:
the program mode corresponding to a second program pulse applied after the first program pulse is determined as one selected from a first mode, a second mode, and a third mode, the first mode to apply the second program pulse to change or adjust a threshold voltage of the at least one non-volatile memory cell by a first level which is equal to, or larger than, that caused by the first program pulse; the second mode to apply the second program pulse to change or adjust the threshold voltage of the at least one non-volatile memory cell by a second level which is smaller than that caused by the first program pulse; and the third mode to apply the second program pulse to the at least one non-volatile memory cell of which a change of the threshold voltage is inhibited.

14. The memory system according to claim 13, wherein the memory device is configured to change a potential of a bit line coupled to the plural non-volatile memory cells.

15. The memory system according to claim 11, wherein the memory device avoids that the level of the first control voltage is lower than a minimum level for operating a transistor connected to the drain select line (DSL).

16. The memory system according to claim 11, wherein the memory device is configured to increase a level of a pass voltage applied to the memory structure, the level of the first control voltage applied to the drain select line (DSL), or a level of a second control voltage applied to a string select line (SSL).

17. A memory system comprising:
a memory device including a string arranged between a bit line and a common source line and coupled to a voltage supply circuit through a drain select line and at least one word line, the string including a drain select transistor and at least one memory cell in series, the drain select transistor coupled to the drain select line, the memory cell coupled to the word line; and
a controller coupled to the memory device and configured to control the memory device to perform a program operation on the memory cell, the program operation including a plurality of program loops,
wherein the voltage supply circuit increases a level of a set control voltage to be applied to the drain select line in one or more initial periods among the plurality of program loops, and
wherein the program operation is performed based on a program mode corresponding to a second program pulse applied to the memory cell after a first program pulse is applied, the program mode determined as one selected from a first mode, a second mode, and a third mode, the first mode to apply the program pulse to change or adjust a threshold voltage of the at least one non-volatile memory cell by a first level which is equal to, or larger than, that caused by the first program pulse; the second mode to apply the second program pulse to change or adjust the threshold voltage of the at least one non-volatile memory cell by a second level which is smaller than that caused by the first program pulse; and the third mode to apply the second program pulse to the at least one non-volatile memory cell of which a change of the threshold voltage is inhibited.

18. The memory system according to claim 17, wherein the level of the set control voltage is determined in response to a temperature of the memory device or a number of the plurality of program loops.

* * * * *